(12) United States Patent
Kanazawa et al.

(10) Patent No.: US 10,866,439 B2
(45) Date of Patent: Dec. 15, 2020

(54) HIGH-FREQUENCY TRANSMISSION LINE AND OPTICAL CIRCUIT

(71) Applicant: NIPPON TELEGRAPH AND TELEPHONE CORPORATION, Tokyo (JP)

(72) Inventors: Shigeru Kanazawa, Atsugi (JP); Yuta Ueda, Atsugi (JP); Josuke Ozaki, Atsugi (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 0 days.

(21) Appl. No.: 15/557,756

(22) PCT Filed: Mar. 23, 2016

(86) PCT No.: PCT/JP2016/001661
§ 371 (c)(1),
(2) Date: Sep. 12, 2017

(87) PCT Pub. No.: WO2016/152152
PCT Pub. Date: Sep. 29, 2016

(65) Prior Publication Data
US 2018/0067341 A1 Mar. 8, 2018

(30) Foreign Application Priority Data
Mar. 23, 2015 (JP) ................ 2015-059542

(51) Int. Cl.
*G02F 1/015* (2006.01)
*H01S 5/026* (2006.01)
(Continued)

(52) U.S. Cl.
CPC .............. *G02F 1/015* (2013.01); *H01P 5/028* (2013.01); *H01S 5/026* (2013.01); *H01S 5/042* (2013.01);
(Continued)

(58) Field of Classification Search
CPC ........ G02F 1/015; H01P 5/028; H01S 5/0236; H01S 5/042; H01S 5/0425; H01S 5/06258
See application file for complete search history.

(56) References Cited

U.S. PATENT DOCUMENTS 6,018,283 A * 1/2000 Kyhl .................. H01P 3/081
257/664
2002/0175388 A1 11/2002 Miyahara
2012/0328229 A1 12/2012 Kogo et al.

FOREIGN PATENT DOCUMENTS

JP 2003-78196 A 3/2003
JP 2013-8887 A 1/2013

OTHER PUBLICATIONS

Extended Search Report dated Jun. 27, 2018, issued in EP Application No. 16768058.6.
(Continued)

*Primary Examiner* — Samuel S Outten
(74) *Attorney, Agent, or Firm* — Workman Nydegger

(57) ABSTRACT

A high-frequency transmission line is provided that improves a high-frequency characteristic. The high-frequency transmission line includes a first conductor line, a termination resistance connected to the first conductor line, a second conductor line connected to the termination resistance, and a ground line that is provided to be opposed to the first conductor line, the termination resistance, and the second conductor line to have a predetermined distance thereto and that is connected to the second conductor line.

(Continued)

The first conductor line and the ground line are formed to have a line width decreasing toward the termination resistance, respectively.

5 Claims, 37 Drawing Sheets

(51) Int. Cl.
   *H01S 5/042*     (2006.01)
   *H04B 3/00*      (2006.01)
   *H01P 5/02*      (2006.01)
   *H01S 5/0625*    (2006.01)
   *H04B 10/50*     (2013.01)
   *H04B 10/516*    (2013.01)

(52) U.S. Cl.
   CPC ........... *H01S 5/06258* (2013.01); *H04B 3/00* (2013.01); *H04B 10/503* (2013.01); *H04B 10/516* (2013.01); *G02F 2001/0157* (2013.01); *H01S 5/04257* (2019.08)

(56) References Cited

OTHER PUBLICATIONS

International Preliminary Report on Patentability dated Oct. 5, 2017, issued in PCT Application No. PCT/JP2016/001661, filed Mar. 23, 2016.

Dongchurl Kim et al., *Design and Fabrication of a Transmitter Optical Subassembly (TOSA) in 10-Gb/s Small-Form-Factor Pluggable (XFP) Transceiver*, IEEE Journal of Selected topics in Quantum Electronics, vol. 12, No. 4, Jul./Aug. 2006, pp. 776-782.

S. Kanazawa et al., *8 x 50-Gb/s Simultaneous Operation of EADFB Laser Array Using Flip-Chip Interconnection Technique*, 2014 IEEE International Semiconductor Laster Conference, Sep. 7, 2014, pp. 58-59.

Shigeru Kanazawa et al., *Compact Flip-Chip Interconnection 112-Gbit/s EADFB Laser Array Module with High Eye-Mask Margin*, Journal of Lightwave Technology, vol. 32, No. 1, Jan. 1, 2014, pp. 115-121.

Chengzhi Xu et al., *Performance Improvement of 40-Gb/s Electroabsorption Modular Integrated Laser Module with Two Open-circuit Stubs*, IEEE Photonics Technology Letters, vol. 24, No. 22, Nov. 15, 2012, pp. 2046-2048.

\* cited by examiner

HIGH-FREQUENCY TRANSMISSION LINE AND OPTICAL CIRCUIT

TECHNICAL FIELD

The present invention relates to a termination technique for an optical device operating with a high frequency such as an optical transmitter for optical communication. In particular, the invention relates to a 50 ohm termination technique for an Electroabsorption Modulator (EAM) integrated with a Distributed Feedback (DFB) Laser (EML).

BACKGROUND ART

In recent years, a required communication capacity has been rapidly increasing due to the increase of the use of the Internet, IP telephone, or the downloading of video for example. A demand has been increasing for optical fibers and optical transmitters provided in optical communication machines. An optical transmitter or a component constituting the optical transmitter is called as a Pluggable and has been subjected to rapid modularization based on the specification for easy mounting or exchange.

XFP (10 Gigabit Small Form Factor Pluggable) is one of the industrial standards for a removable module based on 10 gigabit Ethernet (Registered Trademark) (10 GbE). This standard also has resulted in the rapid modularization of light sources provided in optical transmitter modules. This is called as TOSA (Transmitter Optical Sub-Assembly), which is a typical module form including a box-like TOSA module (NPL 1).

In recent years, while the demand for optical transmitters has been increasing, there has been another demand for such an optical transmitter realizing a lower cost while maintaining the performance. Thus, TOSA modules for 100 gigabit transmission per second have been developed and the standardization for an ultrahigh speed of 400 gigabit per second has been actively carried out, showing an increasing demand for the TOSA having a higher performance.

The configuration of a typical box-like TOSA module will be described with reference to FIG. 1 and FIG. 2. FIG. 1 shows the appearance of a typical box-like TOSA module 100. FIG. 2 illustrates the mounting configuration of the interior of the module of a housing shown in FIG. 1.

As shown in FIG. 1, the housing of the module 100 is formed of sintered ceramic or metal based on XFP.

The module 100 includes at least one modulated electric signal power supply wiring terminal 102 penetrating therethrough from a terrace unit 101 of the housing to the inner side of the housing. A DC power supply wiring terminal is also provided in the terrace unit 101.

In FIG. 1, the module 100 includes a ceramic unit 103 and a metal unit 104.

A thin plate 201 called subcarrier is provided away from the housing. The subcarrier 201 includes a wiring pattern obtained by subjecting dielectric material to metal plating or vapor deposition. The subcarrier 201 also includes elements required for an optical semiconductor device. Required elements include, for example, laser diode 202, an optical modulator 203, resistance 204, and a capacitor 205 for example.

The housing is placed on a small metal plate called a carrier 206. The carrier 206 has, at the lower side thereof, a thermoelectric cooling element (TEC: Thermo-Electric Cooler) 207 abutted to the lower part of the housing. This TEC 207 absorbs the heat generated from an element on the subcarrier 201 and the heat is discharged from the lower part of the housing. The TOSA not using the TEC 207 also has been developed from the viewpoints of power saving and a smaller number of parts.

A side face of the housing has a lens 218 or a light extraction window. An optical semiconductor device and a top panel are sealed together in a package by resistance welding for example.

A modulated electric signal power supply wiring 208 and the subcarrier 201 penetrating from the exterior of the housing to the interior conventionally have conduction via a wire-like gold wire 209 or a ribbon-like gold wire 210.

FIG. 3 shows an example of the connection between the TOSA module 100 and a driving driver IC 301.

A signal from the driving driver IC 301 or the power supply (not shown) from a DC power source is generally performed using a flexible printed substrate 302.

The flexible printed substrate 302 is a flexible printed substrate that can be significantly deformed and is called flexi or FPC (Flexible Printed Circuits). The modulation electric signal transmission or DC power supply is performed on the TOSA module 100 via a flexible substrate 302.

A modulation electric signal is transmitted from the driving driver IC 301 to the TOSA module 100 via the flexible substrate 302. In the TOSA module 100, the modulation electric signal thereof is transmitted to an optical semiconductor element 203 via a modulated electric signal power supply wiring terminal 102, a transmission line 208, wires 209 and 210, and a transmission line 211 on the subcarrier. The modulation electric signal thereof is transmitted to a termination resistance 204.

The driving driver IC 301 is designed so as to send a driving waveform at an output impedance of 50 ohm. Thus, the transmission line 211 and the termination resistance 204 are also generally set to 50 ohm. Doing this provides impedance matching in the conventional technique.

The XFP-based TOSA optical module has an operation frequency even including 10 GHz, thus causing an electric signal that tends to have a wave (microwave)-like behavior. Specifically, a reflected wave is generated from a discontinuity point (reflection point) at which no impedance matching is obtained, undesirably causing the reflected wave to move to the driving driver IC 301. Due to the situation as described above, it has been conventionally important to eliminate the discontinuity point (reflection point) between the transmission line 211 and the termination resistance 204.

FIG. 4A to FIG. 4C illustrate the configuration of a conventional EAM integrated DFB laser. FIG. 4A is an allocation diagram of the EAM integrated DFB laser. FIG. 4B is a perspective view of the EAM integrated DFB laser. FIG. 4C is a top view of the EAM integrated DFB laser (an electrode 422 of the DFB laser and electrodes 423 and 424 of the EAM). FIG. 4A illustrates the configuration disclosed in NPL 2.

In the EAM integrated DFB laser 400 shown in FIG. 4A, a high-frequency wiring (GSG) 401 designed with 50 ohm is connected to the EAM 402 of the EML via a wire 403 and is connected via the EAM 402 to a termination circuit 404 of 50 ohm.

As can be seen from FIG. 4B, the EAM integrated DFB laser 400A is configured so that a DFB laser 413 and the EAM 414 are integrated on the n-InP substrate 420.

An active layer 416 of the DFB laser 413 and a light-absorbing layer 417 of an EA modulator 414 both consist of an InGaAsP/InGaAsP Multi-Quantum Well (MQW) structure and are connected by a butt joint 418.

The active layer 416 and the light-absorbing layer 417 have thereon a p-InP layer 419. This p-InP layer 419 is formed to have a mesa-like pattern and is subsequently buried by Semi-Insulating (SI) InP 421.

As shown in FIG. 4B and FIG. 4C, the electrode 422 of the DFB laser 413 and the electrode 424 of the EAM 414 have therebetween a separation groove 415.

The electrode 423 of the EAM 414 has a pad electrode 424 for the purpose of forming a bonding wire or a flip chip bonding. The DFB laser 413 has a length of 450 μm and the EAM 414 has a length of 150 μm.

The example shown in FIG. 4A provides a case where an n electrode (the lower part of the n-InP substrate 420) connected to the ground G of high-frequency wiring 401 and the electrode 424 connected to signal S are provided on different faces of the EML, respectively.

On the other hand, as shown in FIG. 5A and FIG. 5B, another type of EML also has been known in which the respective electrodes connected to the ground G and the signal S are provided on the same face of the EML.

FIG. 5A and FIG. 5B show how the high-frequency wiring and the EML are connected by the flip chip bonding and show a case where the respective electrodes 231 and 240 connected to the ground G and the signal S are provided on the same face. In FIG. 5A, an n-InP substrate 213 has thereon an n-contact layer 238, an n-InP 237, a light-absorbing layer 235, a p-InP 234, and a p contact layer 233. A Semi-Insulating (SI) InP 236 is used to bury mesa. A p electrode 231 connected to the signal S and an n electrode 240 connected to the ground G are formed on an insulating film (e.g., SiO2) 232. Specifically, the n electrode 240 and the p electrode 231 are both formed on the same face.

The respective electrodes 231 and 240 have thereon an Au bump 215. The EML is connected to a high-frequency wiring plate 201 via the Au bump 215, a gold-tin soldering (bump) 218, and an electrode pad 217.

Recently, the demand has been increasing for an ultra-high-speed transmitter providing 100 gigabit per second or 400 gigabit per second for example.

FIG. 6A to FIG. 6C show the configuration of a conventional multichannel optical transmitter 500. FIG. 6A illustrates the entire configuration of the multichannel optical transmitter 500. FIG. 6B shows the configuration of 1 channel. FIG. 6C illustrates the outline of 4 channels output. The multichannel optical transmitter 500 is disclosed in NPL 3.

The multichannel optical transmitter 500 has four EMLs each operating at 25 Gb/s and is configured to operate at 100 Gb/s.

The EML consists of a DFB laser (LD) and an EA modulator (EAM) for modulating output light from the DFB laser at 25 Gb/s. FIG. 6B corresponds to FIG. 4C. FIG. 6B illustrates the electrode 422 of the DFB laser and the electrodes 423 and 424 of the EA modulator.

The output lights from the four EMLs have different wavelengths, respectively. These wavelengths are different from one another and the four lights are multiplexed by a MMI (Multi-Mode Interference)-type light coupler. A light coupler for a multiplexing purpose also may be a wavelength coupler or a polarization coupler.

FIG. 7A to FIG. 7E show connection configurations between a four-channel EML and a high-frequency wiring. FIG. 7A shows the connection configuration by a conventional wire. FIG. 7B shows an equivalent circuit of FIG. 7A. FIG. 7C shows the connection configuration by a gold bump. FIG. 7D shows the equivalent circuit of FIG. 7 C. FIG. 7E shows the respective high-frequency characteristics of the two connection configurations. In FIG. 7E, the reference symbol t1 shows the high-frequency characteristic of the connection configuration shown in FIG. 7C and the reference symbol t2 shows the high-frequency characteristic of the connection configuration shown in FIG. 7A, respectively.

In order to connect the 4-channel EML and the high-frequency wiring via a wire, a example structure is shown in FIG. 7A. Specifically, FIG. 7A shows that the EA modulator of the EML (EAM) and a wiring plate 604 are connected by a bonding wire 601.

In FIG. 7A, a multichannel optical transmitter 600 includes a signal line 602, an EADFB laser array 603, a subcarrier 605, an EAM pad 607, and a spacer 606.

This multichannel optical transmitter 600 of FIG. 7A has an equivalent circuit as shown in FIG. 7B. The wiring plate 604 is connected to the EAM 6046 via a coil 6048 (corresponding to a bonding wire) and is connected to a 50 ohm (Ω) termination 6050 via a coil 6049 (corresponding to a bonding wire).

FIG. 7B shows an R clad 6041, a C pad 6042, a C active 6043, an R active 6044, an Rn clad 6045, and an active layer 6047 (light-absorbing layer).

The above-described R clad 6041 corresponds to the resistance of the clad layer 419 shown in FIG. 4B, the C pad 6042 corresponds to the capacitance of the pad 424 shown in FIG. 4B, and the C active 6043 corresponds to the capacitance of the light-absorbing layer 417 shown in FIG. 4B, respectively. The R active 6044 corresponds to the resistance of the light-absorbing layer 417 shown in FIG. 4B and the Rn clad 6045 corresponds to the resistances of the clad layer 419 and the substrate 420 shown in FIG. 4B, respectively.

In order to increase the EML operation bandwidth, the use of the above-described bonding wire may be substituted with another method to use the flip chip bonding shown in FIG. 5A and FIG. 5B to directly connect the EAM electrode 607 and the wiring plate 604 via a gold bump (or via the Au bump 215 in the example shown in FIG. 5A and FIG. 5B). FIG. 7C shows a connection configuration of the flip chip bonding as in FIG. 5A and FIG. 5B. FIG. 7D shows an equivalent circuit of the connection configuration.

In FIG. 7C, the EA modulator of the EML (EAM) and the wiring plate 614 are connected by a gold bump 613.

In FIG. 7C, the multichannel optical transmitter 600A includes an upper layer signal line 610, a lower layer signal line 611, an RF via 612, a high-frequency circuit plate 614, and a subcarrier 615.

In FIG. 7D, the wiring plate 614 is connected to the EAM 6046A and the 50 ohm termination 6050A, respectively.

In FIG. 7D, the active layer 6047A (light-absorbing layer) is shown.

The above-described flip chip bonding is one of the methods to mount a chip on a mounting substrate. According to the flip chip bonding, a chip surface is electrically connected to a substrate not by a wire as in the wire bonding but by gold bumps arranged in an array-like manner. This consequently provides, when compared with the wire bonding, a very short distance between the lower layer signal line 611 and the EAM electrode 607, thus providing a very-short wiring. Thus, as shown in FIG. 7E, the high-frequency characteristic t1 in the case of the flip chip bonding is superior to the high-frequency characteristic t2 in the case of the wire bonding.

The reason is that, while the flip chip bonding causes a gradual deterioration of the high-frequency characteristic in accordance with the increase of the frequency, the wire bonding allows a frequency peaking and also causes the high-frequency side to tend to have a rapid deterioration of the high-frequency characteristic.

Importance is placed on the improvement of the high-frequency characteristic by the reduction of the parasitic inductance.

The above-described wiring plate is formed by a micro strip line as shown in FIG. 8A. In the dielectric material substrate of FIG. 8A, an upper face conductor 701a having the width W functions as a transmission line and a lower face conductor 701b functions as GND. The conductors 701a and 701b have therebetween dielectric material 702.

Characteristic impedance of the transmission line depends on the relative permittivity and the thickness of the substrate, as well as the thickness and width of the conductor for example, as shown in FIG. 8B. The use of a substrate having a high relative permittivity can provide a circuit having a smaller size. Generally, the use of substrate materials as shown below has been known: a glass epoxy substrate (relative permittivity εr=4.8), a Teflon (Registered Trademark) substrate (relative permittivity εr=2.6), and a ceramic substrate (relative permittivity εr=10.0).

The wiring plate is formed with a coplanar line as shown in FIG. 8C for example. In FIG. 8C, the dielectric material substrate having the thickness=h and the relative permittivity=εr has one surface assumed as a conductor side. The conductor side has two slots having the slot width=S to have the slot interval W therebetween. The dielectric material substrate has a so-called GSG structure in which both side conductors are GND while the center conductor is a signal. FIG. 8D shows a characteristic impedance depending on the value of s/h in the wiring plate for which w/h=1.0 is established.

FIG. 9A and FIG. 9B show the outline of a termination circuit pattern 800 of the conventional EML using the flip chip bonding.

In the circuit pattern 800 shown in FIG. 9A the same 50 ohm design is applied not only to the high-frequency line S (801) for sending a signal to the EA modulator 804 of the EML (EAM) but also to the high-frequency line 801 just before the termination resistance 803. FIG. 9A shows an example where the EAM signal electrode and the GND electrode G (802) are both provided on the same face. The EAM signal electrode is flip chip-bonded to the high-frequency line S of the wiring plate and the EAM GND electrode is flip chip-bonded to the ground line G of the wiring plate, respectively.

The 50 ohm termination resistance 803 may be obtained by soldering the chip resistor to the wiring plate or by providing the chip resistor in the wiring plate. When the chip resistor is provided in the wiring plate, then the termination resistance 803 is also set to 50 ohm. The termination resistance 803 should be made shorter in order to reduce the parasitic capacitance. The termination resistance 803 and the ground line G at the right side thereof are directly connected without having a gap therebetween so that no parasitic component is included.

When the EAM GND electrode is provided at an opposite side (or the back face) of the signal electrode, only the signal electrode and the high-frequency line 801 of the wiring plate are flip-chip bonded as shown in FIG. 9B. In this case, the electrode of the back face and the ground are connected by a method such as the bonding wire or via.

FIG. 10 and FIG. 11 show the via connection configuration of the EAM GND electrode and the ground in the case where the EAM GND electrode is provided at an opposite side (or the back face) of the signal electrode. The connection configuration shown in FIG. 10 and FIG. 11 correspond to the circuit pattern 800 of FIG. 9B.

In FIG. 10, an Au bump 813 is used to connect a high-frequency wiring plate 830 (Dash-dotted line) to an EAM 804 on a subcarrier 820. An Au bump 815 is used to connect the high-frequency wiring plate 830 to a high-frequency wiring plate 831 for a wiring layout purpose. In the connection example of FIG. 10, a current path I has a path in an order of the flip chip bonding 813→the bottom face of the EAM 804→the subcarrier 820→the high-frequency wiring plate 831.

As shown in FIG. 11, the single signal S of the EAM 804 is subjected to the flip chip bonding 813. A subcarrier 820 has thereon the EAM 804 provided by soldering for example. Generally, the EAM 804 has a thickness of about 150 μm thinner than that of the high-frequency wiring plate 831, thus allowing the subcarrier 820 to have an uneven shape as shown in FIG. 11.

In FIG. 11, two Au electrodes 816a and 816b are connected.

The Au electrode 816b and the ground G of the high-frequency wiring plate 830 are connected by the via 833. The two high-frequency wiring plates 830 and 831 are connected by a flip chip bonding 815.

CITATION LIST

Non Patent Literature

NPL 1: Dongchurl Kim et al., "Design and Fabrication of a Transmitter Optical Subassembly (TOSA) in 10-Gb/s Small-Form-Factor Pluggable (XFP) Transceiver", IEEE JOURNAL OF SELECTED TOPICS IN QUANTUM ELECTRONICS, VOL. 12, NO. 4, JULY/AUGUST 2006, pp 776-782

NPL 2: Chengzhi Xu et al., "Performance Improvement of 40-Gb/s Electroabsorption Modulator Integrated Laser Module With Two Open-Circuit Stubs", IEEE PHOTONICS TECHNOLOGY LETTERS, VOL. 24, NO. 22, Nov. 15, 2012

NPL 3: Shigeru Kanazawa et al., "Compact Flip-Chip Interconnection 112-Gbit/s EADFB Laser Array Module With High Eye-Mask Margin", JOURNAL OF LIGHTWAVE TECHNOLOGY, VOL. 32, NO. 1, Jan. 1, 2014

SUMMARY OF INVENTION

The structure shown in FIG. 9A and FIG. 9B can provide the impedance matching by setting a transmission line 801 and a termination resistance 803 to 50 ohm, respectively. By reducing the length of the termination resistance 803, the parasitic inductance can be reduced. However, although the impedance matching between the transmission line 801 and the termination resistance 803 is considered, the impedance matching including the EAM 804 is not considered.

The EAM performs the modulation by absorbing the light of the DFB laser to increase the light loss. The applied voltage is −3V (LOW) to −0.5V (HIGH) for example to allow the light-receiving current of about 15 mA to flow. Specifically, this can be calculated as the resistance of about 200 ohm, which may significantly deviate from the 50 ohm line. In addition, the EAM equivalent circuit or the high-frequency wiring for example also includes a parasitic component having an impedance of an imaginary part such as a capacitor. Thus, it is generally difficult to achieve the impedance matching in a wider bandwidth including a high-frequency region exceeding 10 GHz for example, by only using resistance material only having a real part value of impedance. Furthermore, the light-receiving current also changes depending on the light intensity, wavelength, or temperature for example. Thus, achieving the impedance matching including EAM is desired.

A high-frequency transmission line for solving the above problem includes: a first conductor line having a predetermined characteristic impedance, a termination resistance connected to the first conductor line, a second conductor line connected to the termination resistance, and a ground line that is provided to be opposed to the first conductor line, the termination resistance, and the second conductor line to have a predetermined distance thereto and that is connected to the second conductor line, and the first conductor line and the ground line are formed so as to have a line width decreasing toward the termination resistance side, respectively.

The termination resistance and the second conductor line may have a characteristic impedance set to be higher than the characteristic impedance of the first conductor line by a combination with the ground line.

The first conductor line and the ground line may have the line width narrowed by a tapered shape.

An optical circuit for solving the above problem includes the high-frequency transmission line. The optical circuit is an EA modulator integrated DFB laser. The EA modulator has a signal input electrode and a ground electrode. The signal input electrode may be connected to the first conductor line.

The ground electrode may be connected to the ground line.

The signal input electrode may be flip-chip connected to the first conductor line.

According to the present invention, the high-frequency characteristic is improved.

DESCRIPTION OF EMBODIMENTS

The following section will describe an embodiment of a high-frequency transmission line 1 of the present invention. This high-frequency transmission line 1 is configured to transmit a signal to EML.

Configuration of High-Frequency Transmission Line

Figure 12:
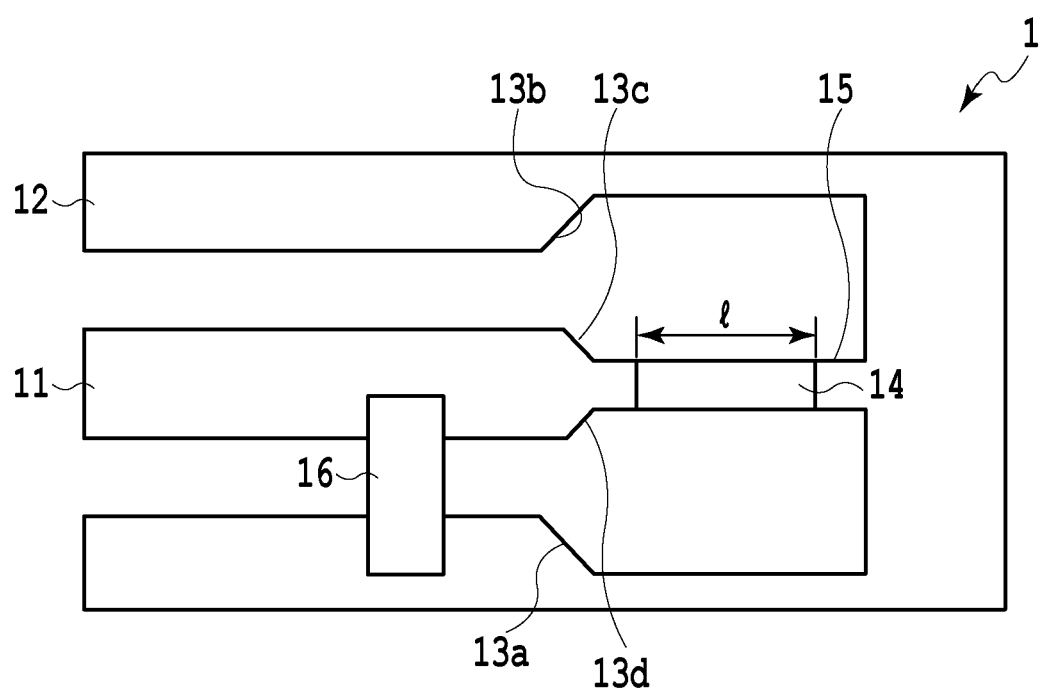
FIG. 12 illustrates a configuration example of a high-frequency transmission line in an embodiment of the present invention.
Figure 13:
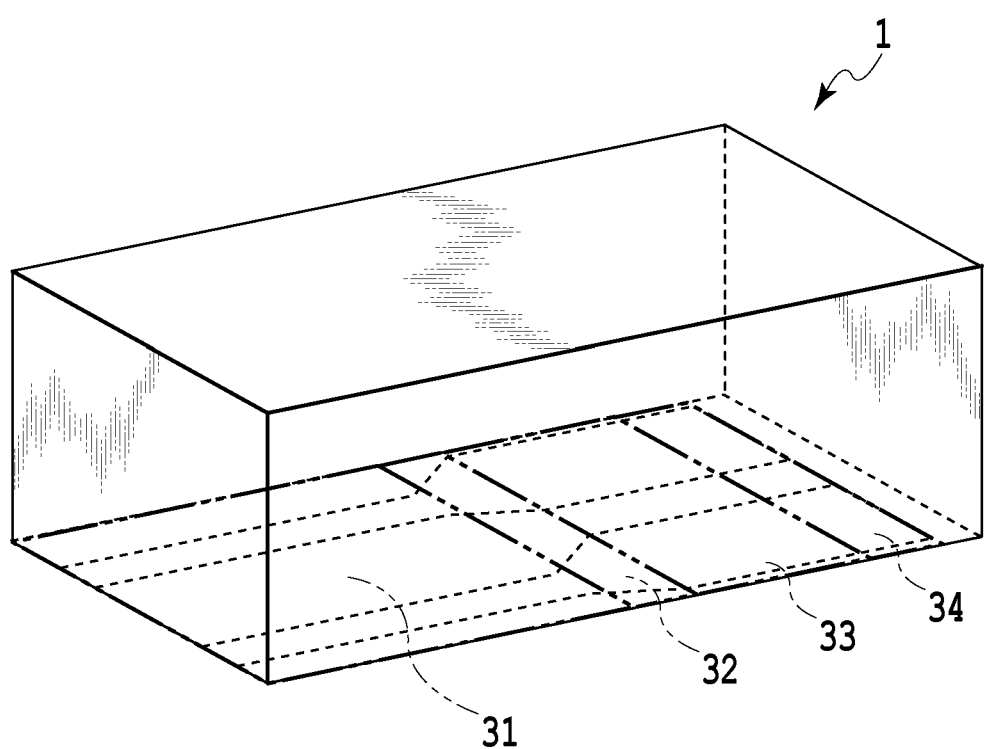
FIG. 13 is a perspective view illustrating one example of a high-frequency wiring plate.

First, the following section will describe the configuration of the high-frequency transmission line 1 with reference to FIG. 12 and FIG. 13. FIG. 12 is a schematic view illustrating a configuration example of the termination apparatus of the high-frequency transmission line 1. FIG. 13 is a perspective view illustrating the high-frequency transmission line 1.

As shown in FIG. 12, the high-frequency transmission line 1 includes the first conductor line 11, a termination resistance 14 of this first conductor line 11, a second conductor line 15 connected to the termination resistance 14, and a ground line 12 that is provided to be opposed to the first conductor line 11, the termination resistance 14, and the second conductor line 15 to have a predetermined distance therebetween and that is connected to the second conductor line 15. One end of the termination resistance 14 is connected to one end of the first conductor line 11. The other end of the termination resistance 14 is connected to one end of the ground line 12.

In this embodiment, the length of the termination resistance 14 is set to "l" (of alphabetical character). The value of "l" is set so as to increase the parasitic inductance.

The conductor lines 11 and 15 are a high-frequency wiring plate for example. The first conductor line 11 has a characteristic impedance set to 50Ω (ohm) for example.

Figure 5A:
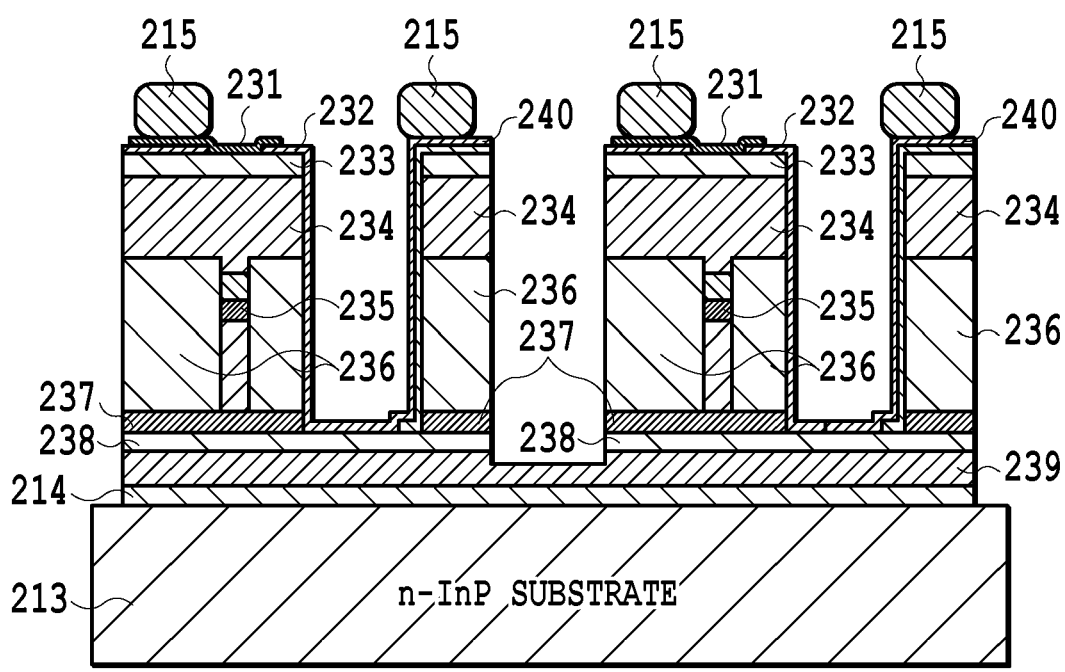
FIG. 5A illustrates the connection configuration of the high-frequency wiring and the EML using flip chip bonding.
Figure 5B:
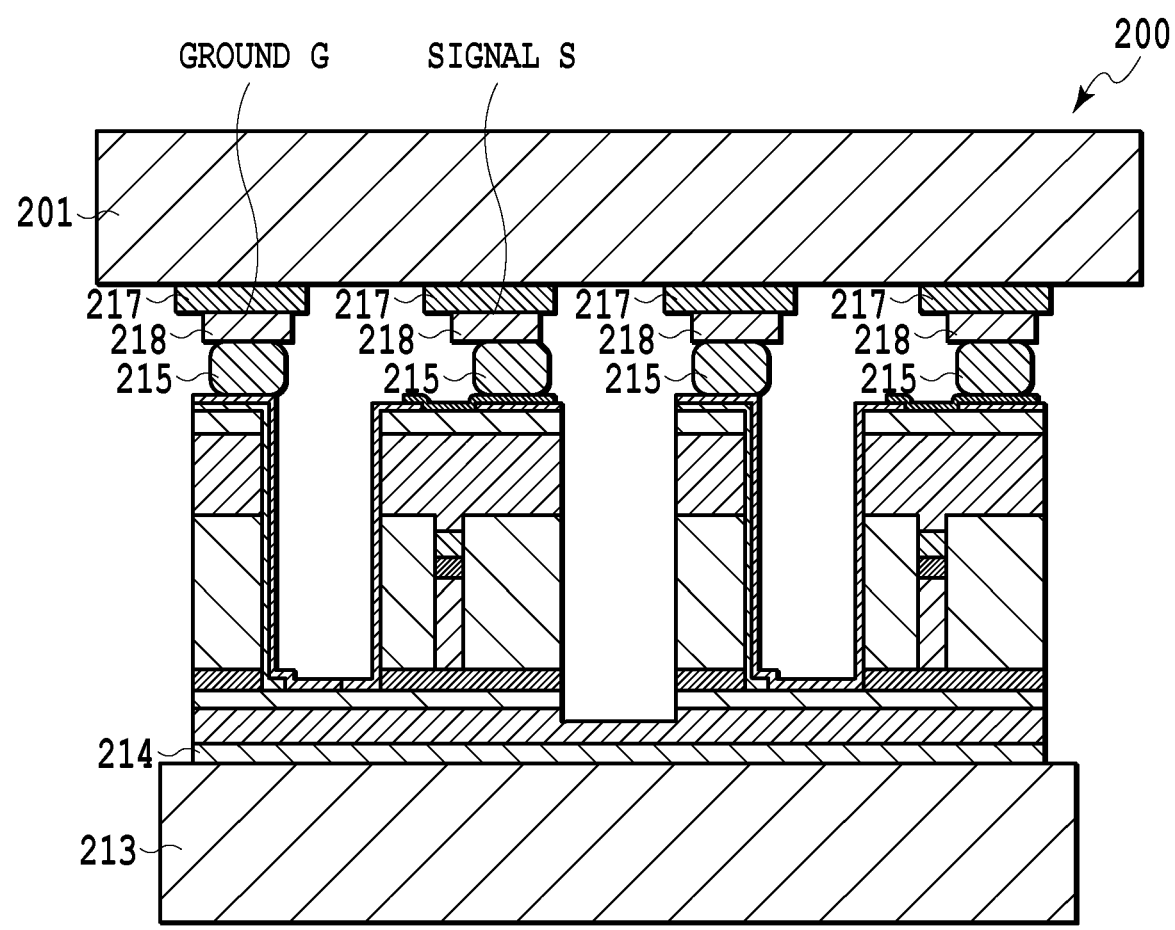
FIG. 5B illustrates the connection configuration of the high-frequency wiring and the EML using the flip chip bonding.
Figure 6A:
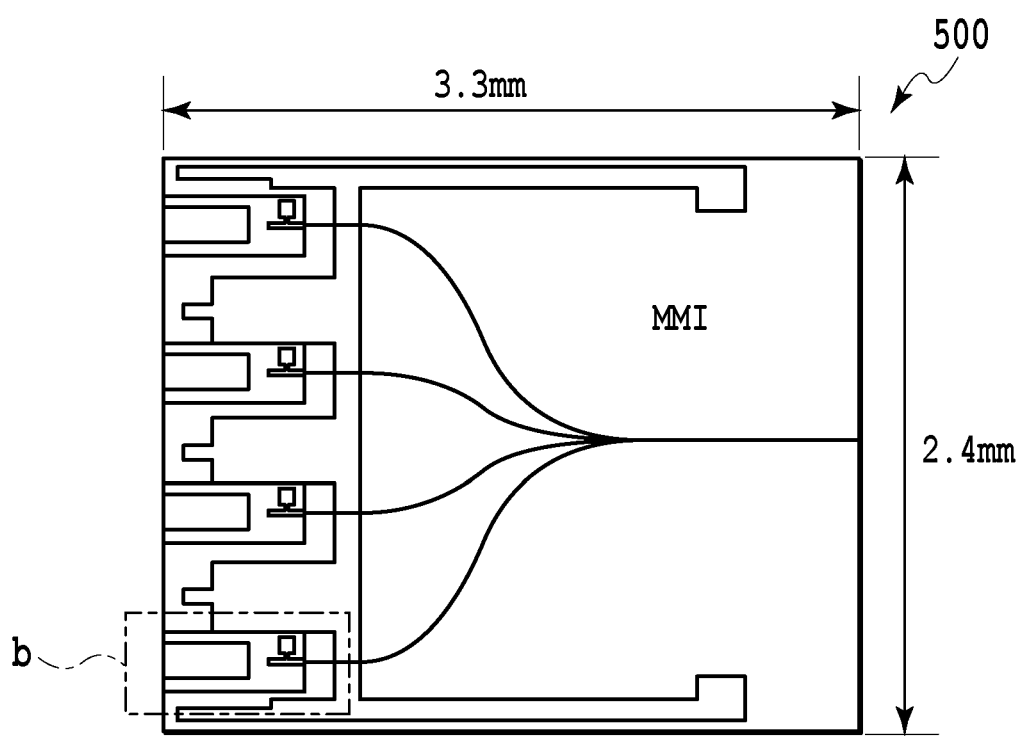
FIG. 6A illustrates the entire configuration of a conventional multichannel optical transmitter.
Figure 6B:
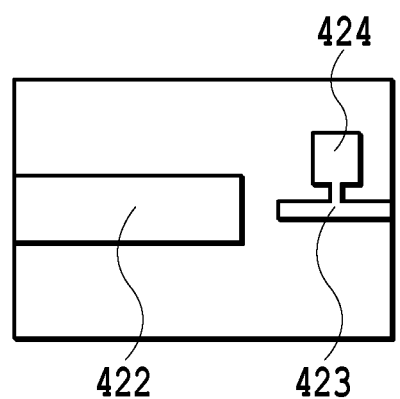
FIG. 6B shows the configuration of one channel in the multichannel optical transmitter shown in FIG. 6A.
Figure 6C:
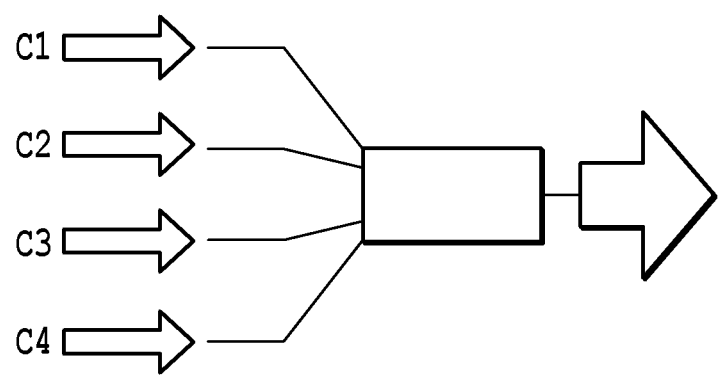
FIG. 6C shows the outline of the outputs of four channels in the multichannel optical transmitter shown in FIG. 6A.

In FIG. 12, the EAM 16 of the EML is connected between the conductor line 11 and the ground line 12. In this embodiment, the EAM 16 has the signal electrode and the ground electrode that are both configured on the same face of the EAM 16. Thus, the signal electrode of the EAM 16 is flip-chip bonded to the conductor line 11 and the ground electrode of the EAM 16 is flip-chip bonded to the ground line 12, respectively. The connection configuration of the flip chip bonding is the same as those shown in FIG. 5A and FIG. 5B for example.

The first conductor line 11 has, at an end face of the termination resistance 14 side, bent shapes 13c and 13d that are inwardly bent. In the example of FIG. 12, the bent shapes 13c and 13d have a tapered shape having a decreasing line width for example.

The ground line 12 has, at positions corresponding to the above-described respective bent shapes 13c and 13d, bent shapes 13b and 13a that are outwardly bent. In the example of FIG. 12, the bent shapes 13a and 13b have a tapered shape having a decreasing line width for example.

Thus, the part of the bent shapes 13a to 13d have a characteristic impedance that changes so as to exceed 50Ω toward the termination resistance 14. This part constitutes an impedance transition unit 32 shown in FIG. 13.

The part of the termination resistance 14 and the ground line 12 opposed thereto shown in FIG. 12 have a characteristic impedance exceeding 50Ω. This part constitutes the first high impedance unit 33 shown in FIG. 13.

One end of the second conductor line 15 is connected to the termination resistance 14 and the other end is connected to the ground line 12. Specifically, the termination resistance 14 is not directly connected to the ground line 12. The second conductor line 15 is combined with the corresponding ground line 12 to constitute the second high impedance line unit 34 shown in FIG. 13. This second high impedance line unit 34 functions as a stab by which amount of frequency peaking (which will be described later) is adjusted.

In FIG. 13, the 50Ω line 31 corresponds to the part of the conductor line 11 having an impedance characteristic of 50Ω.

Figure 14:
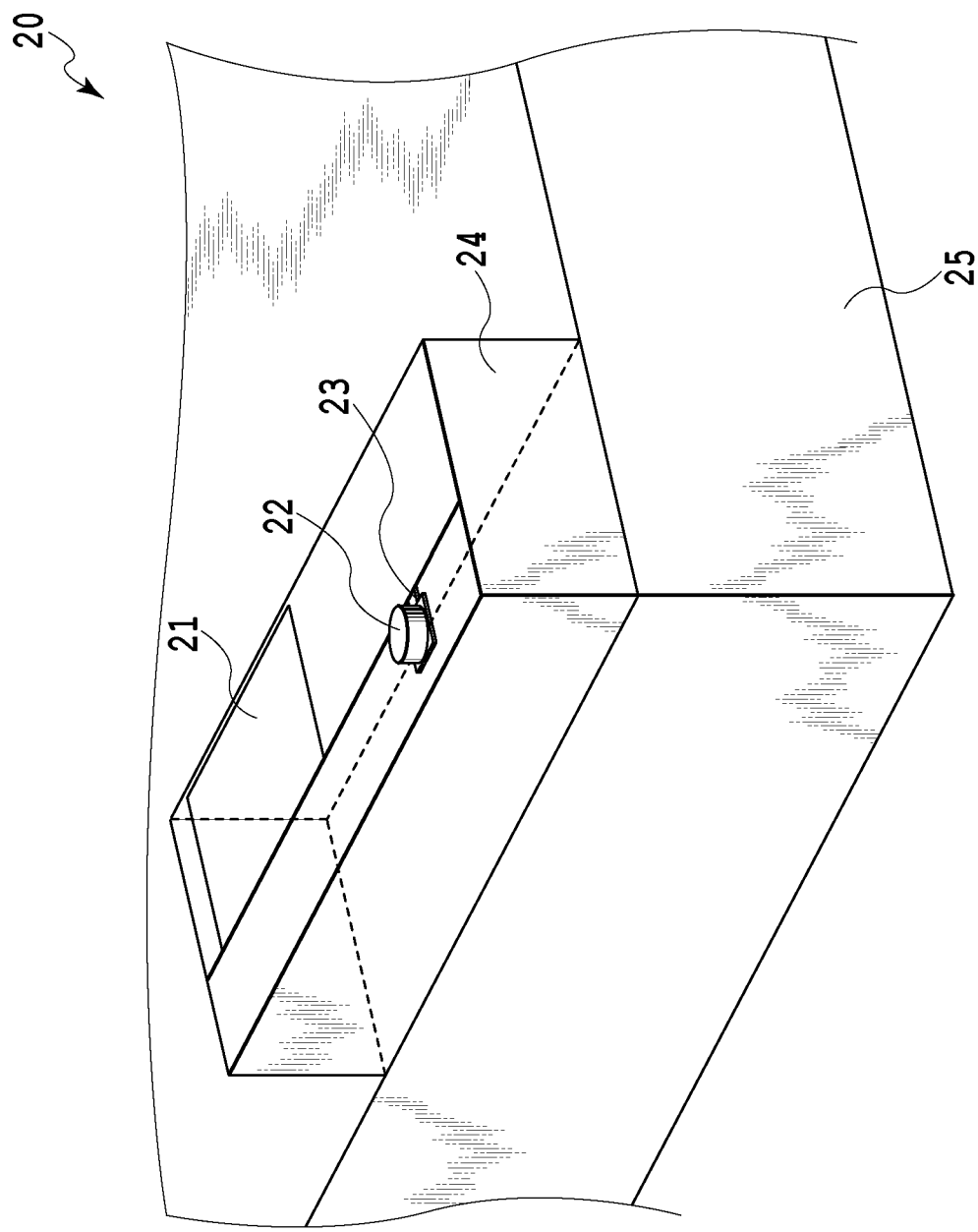
FIG. 14 is a perspective view illustrating one example of an EADFB laser chip to be connected to the high-frequency wiring plate.

Next, the following section will describe an EA modulator integrated DFB laser 20 (which will be hereinafter abbreviated as "DFB laser") combined with this termination apparatus 1 with reference to FIG. 14. FIG. 14 is a perspective view illustrating one example of the DFB laser 20.

As shown in FIG. 14, the DFB laser 20 includes a DFB laser electrode 21, a gold bump 22, an EAM signal electrode 23, a laser chip 24, and a subcarrier 25.

Figure 15:
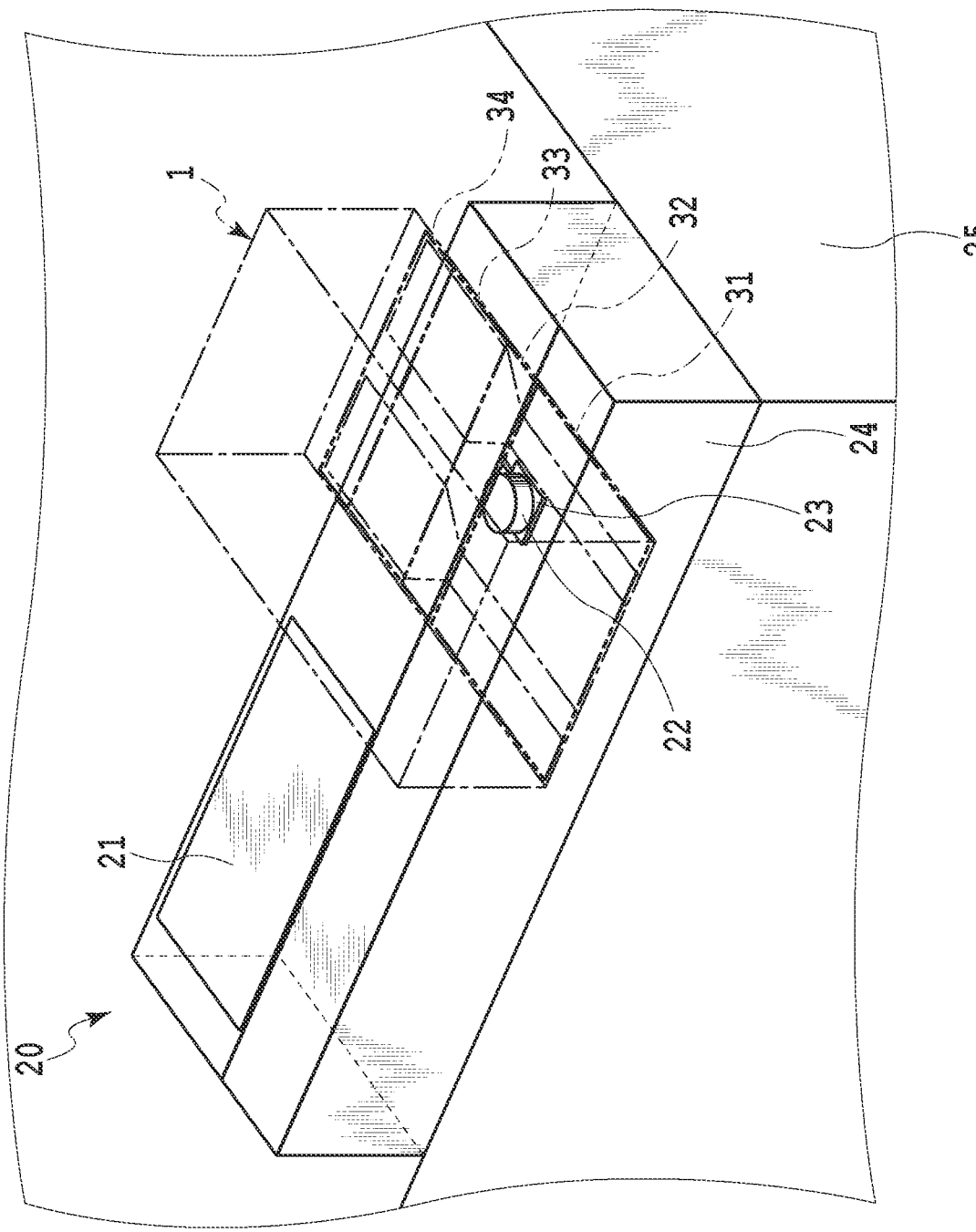
FIG. 15 is a perspective view illustrating an example of the combination of the EADFB laser chip and the high-frequency wiring plate.

FIG. 15 is a perspective view illustrating one example of an optical circuit obtained by combining the high-frequency transmission line 1 (Dash-dotted line) on the DFB laser 20.

In this example, the high-frequency transmission line 1 is connected to the EAM signal electrode 23 shown in FIG. 15 via the gold bump 22.

In FIG. 15, the DFB laser 20 is orthogonal to a high-frequency transmission line 1. However, another configuration also may be used in which the DFB laser 20 and the high-frequency transmission line 1 are superposed in the same direction. When the DFB laser 20 is not used individually but is used in an array structure in particular, the DFB laser 20 and the high-frequency transmission line 1 are preferably provided in the same direction.

Figure 16:
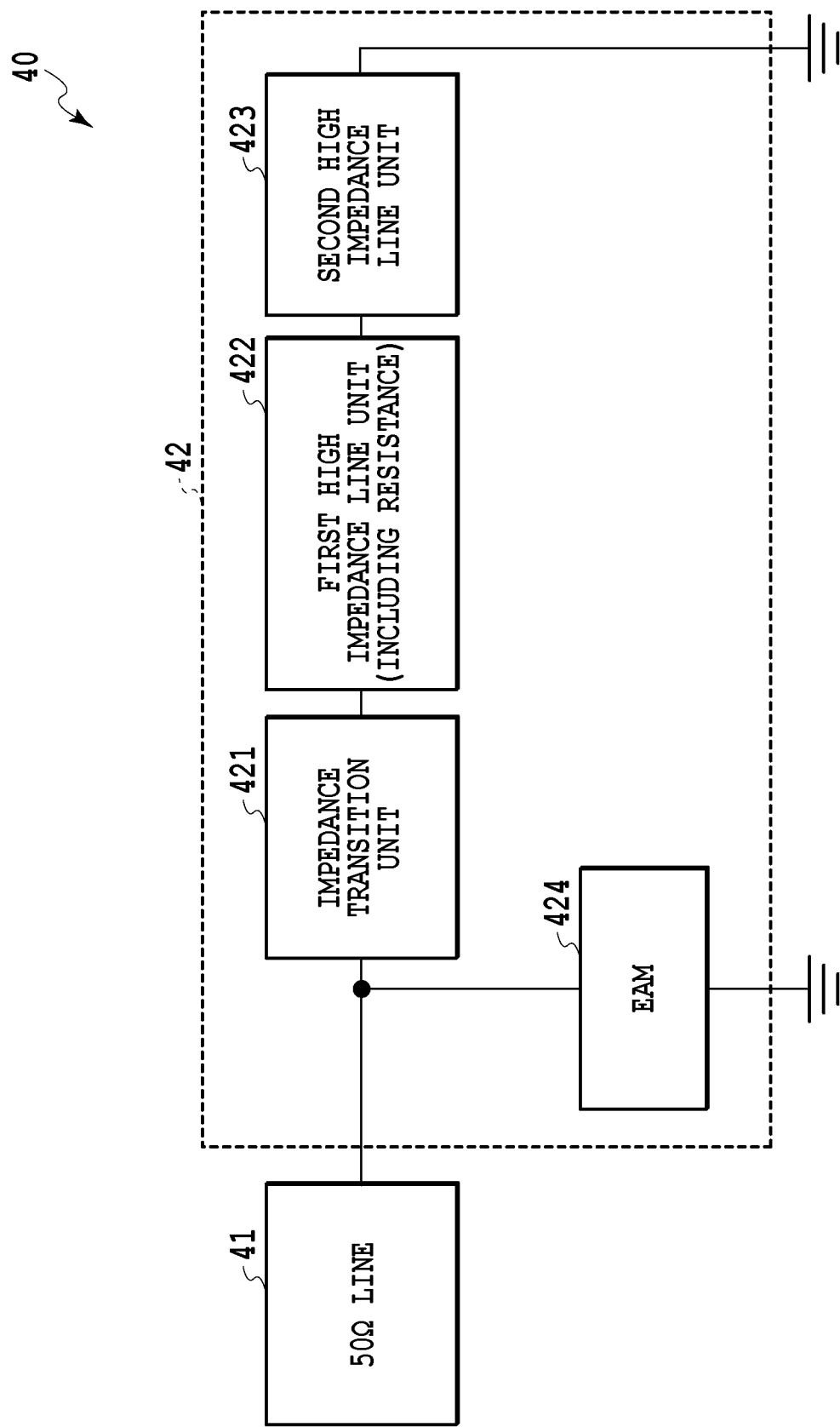
FIG. 16 illustrates one example of the equivalent circuit of FIG. 15.

FIG. 16 illustrates an equivalent circuit 40 of the high-frequency transmission line 1.

This equivalent circuit 40 includes a 50Ω (ohm) line 41 and an impedance adjustment unit 42. The impedance adjustment unit 42 has an impedance transition unit 421 serially connected to the 50Ω line 41, the first high impedance line 422, and the second high impedance line 423. One end of an EA unit 424 is connected between the 50Ω line 41 and the impedance transition unit 421 and the other end of the EA unit 424 is grounded.

In FIG. 16, the circuit elements 41 and 421 correspond to the 50Ω line 31 and the impedance transition unit 32 shown in FIG. 13. The circuit elements 422 and 423 correspond to the first high impedance line unit 33 and the second high impedance line unit 34 shown in FIG. 13, respectively.

Outline of Simulation

Next, with regard to the high-frequency transmission line 1 of this embodiment, a three-dimensional electromagnetic analysis simulator was used to calculate the strength of the optical circuit while changing the length "l" of the termination resistance 14, the interval between the termination resistance 14 and the ground line 12, and the length of the second high impedance line unit 34. The equivalent circuit in this case is shown in FIG. 17.

Figure 17:
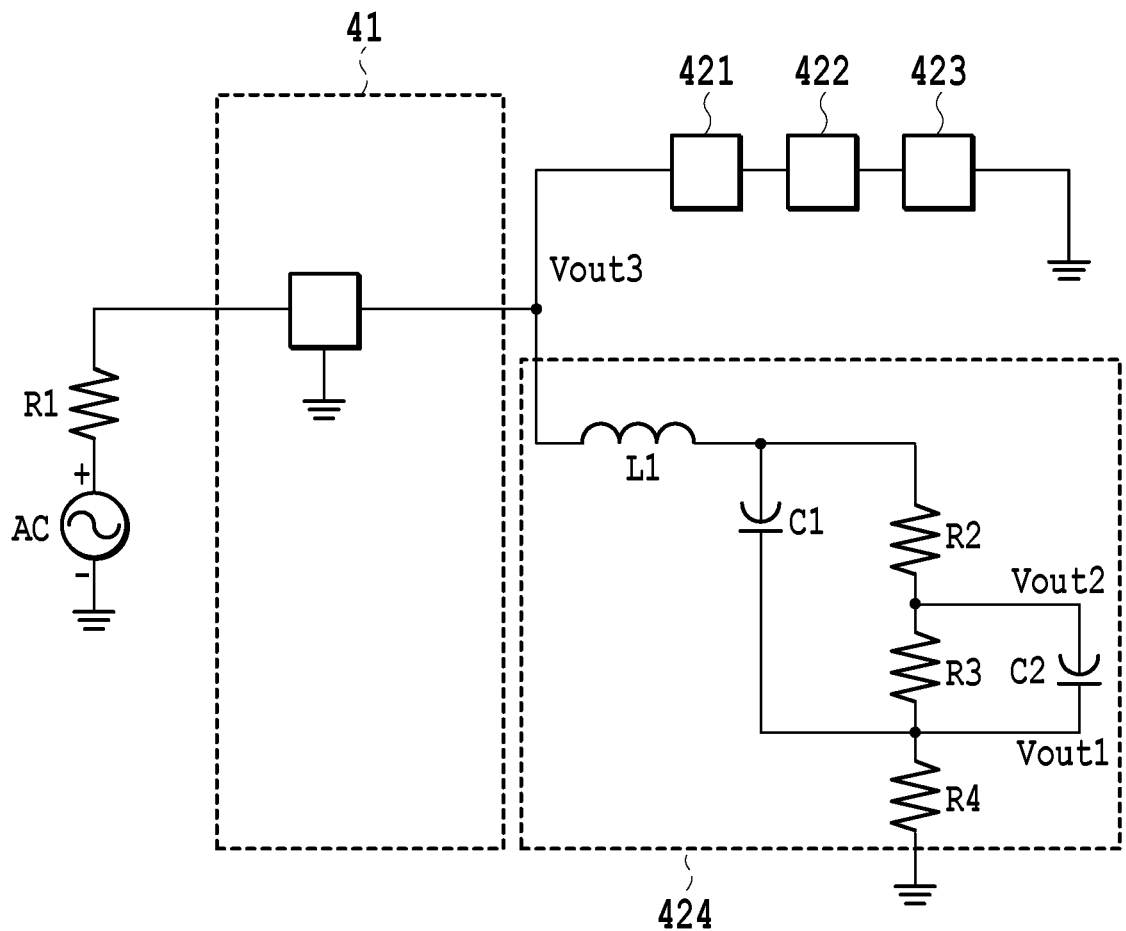
FIG. 17 illustrates one example of the equivalent circuit obtained by simulation.

FIG. 17 illustrates an equivalent circuit including the high-frequency transmission line 1, the EAM, and a gold bump obtained through simulation. The example of FIG. 17 is based on R1=50Ω, L1=0.003 nH, C1=0.038 pF, R2=24.8Ω, R3=98Ω, R4=2Ω, and C2=0.058 pF.

Figure 1:
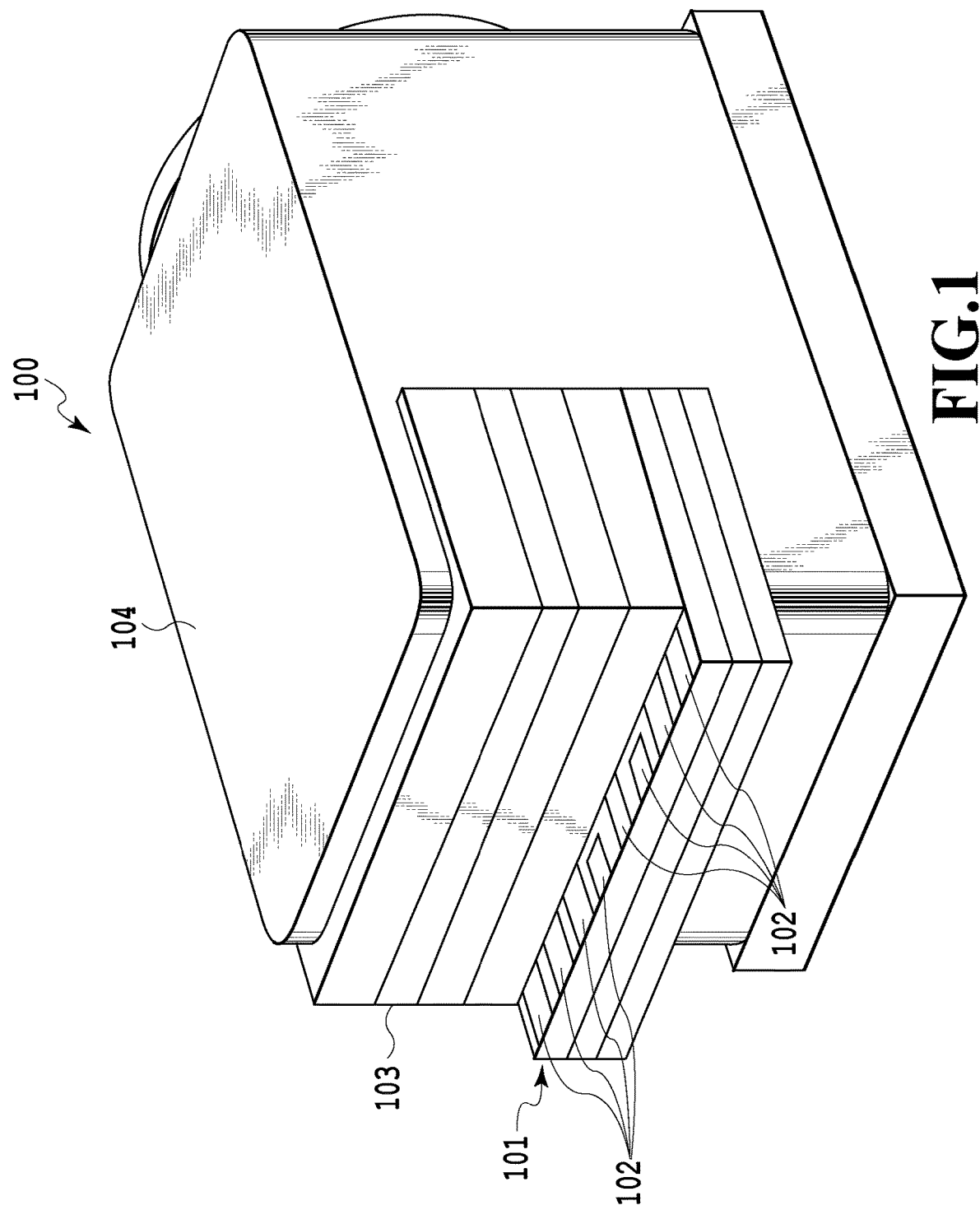
FIG. 1 illustrates the appearance of a typical box-like TOSA module 100.
Figure 2:
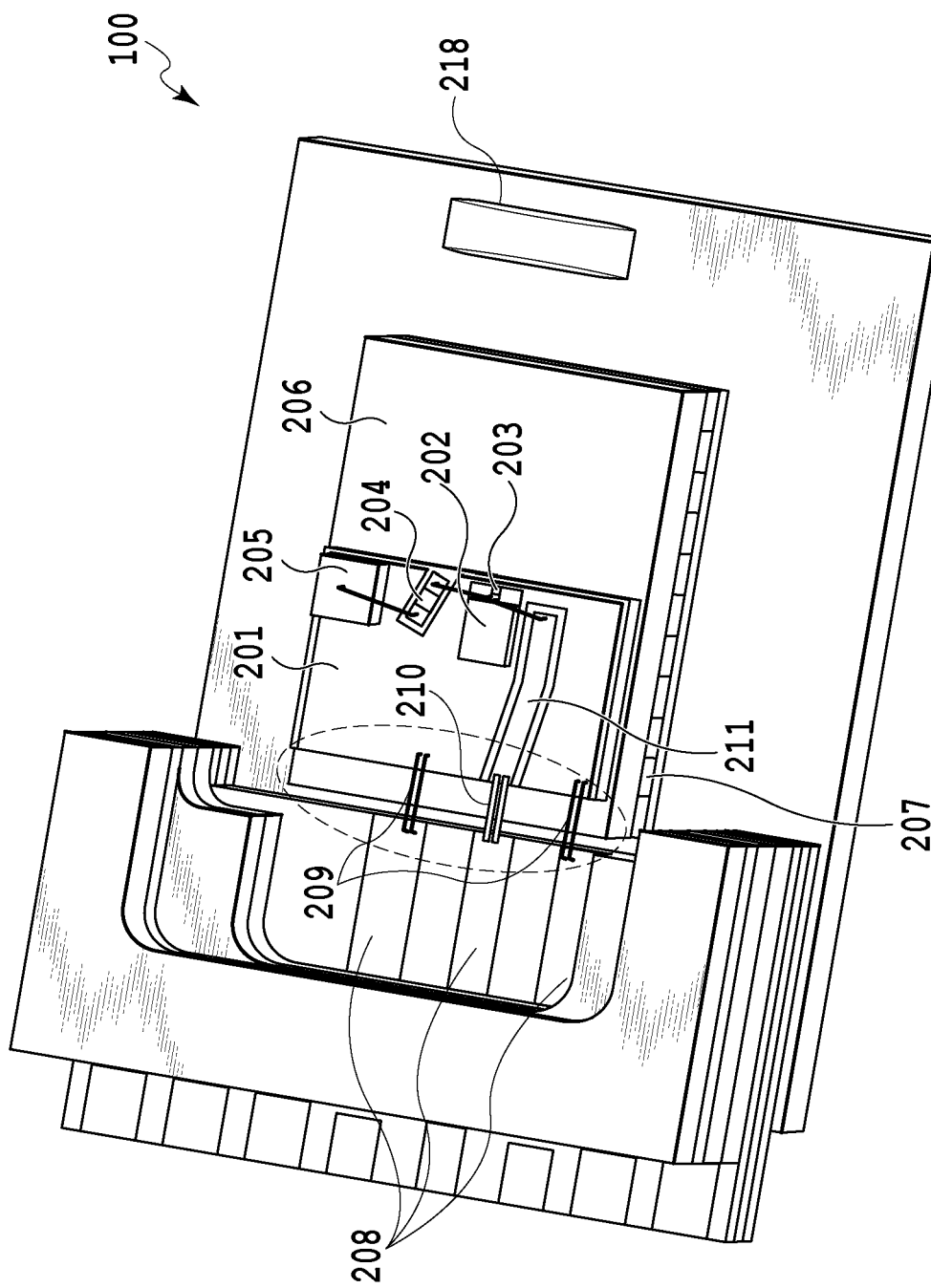
FIG. 2 illustrates the mounting configuration of the interior of the module housing shown in FIG. 1.
Figure 3:
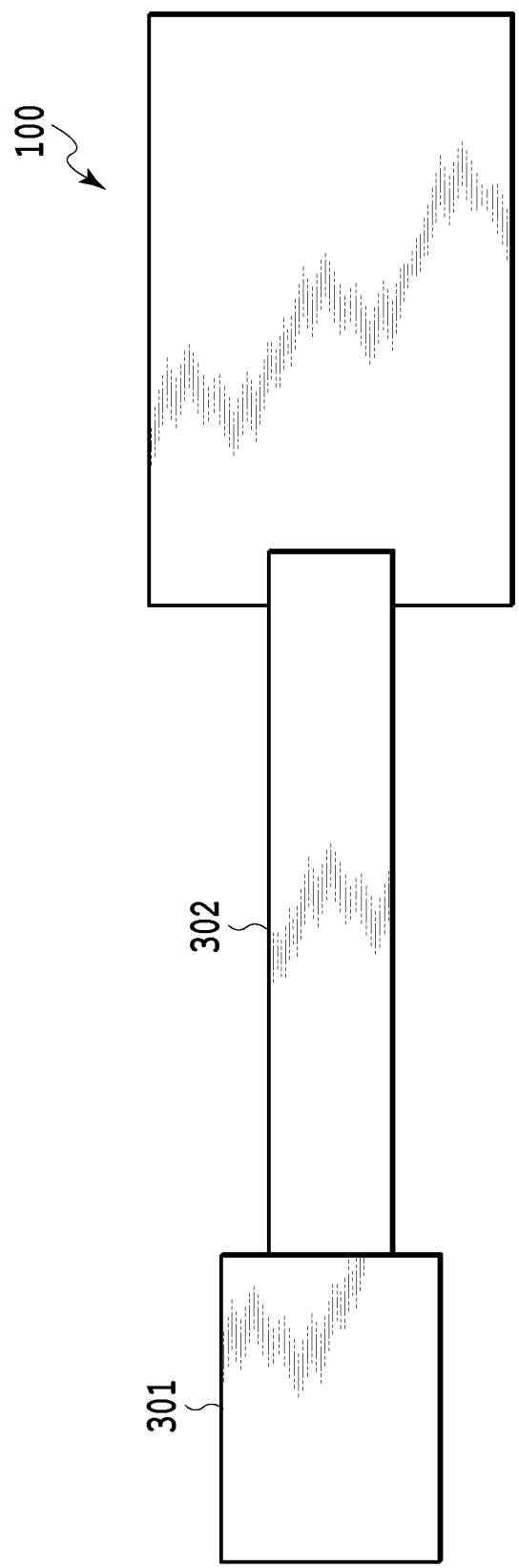
FIG. 3 illustrates the connection configuration of a TOSA module and a driving driver IC.
Figure 4A:
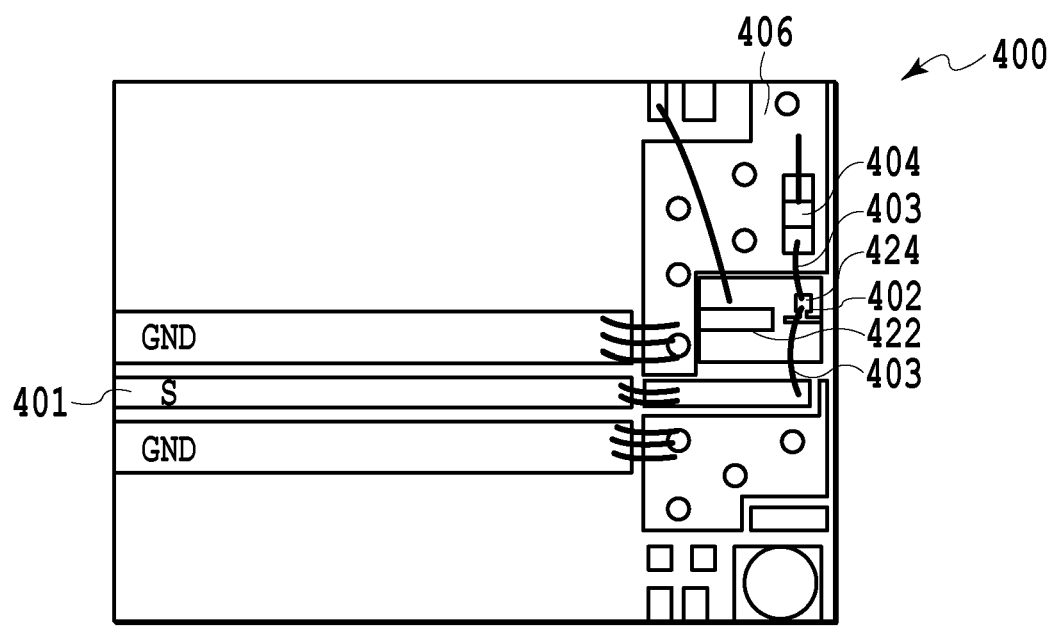
FIG. 4A is an allocation diagram of a conventional EAM integrated DFB laser.
Figure 4B:
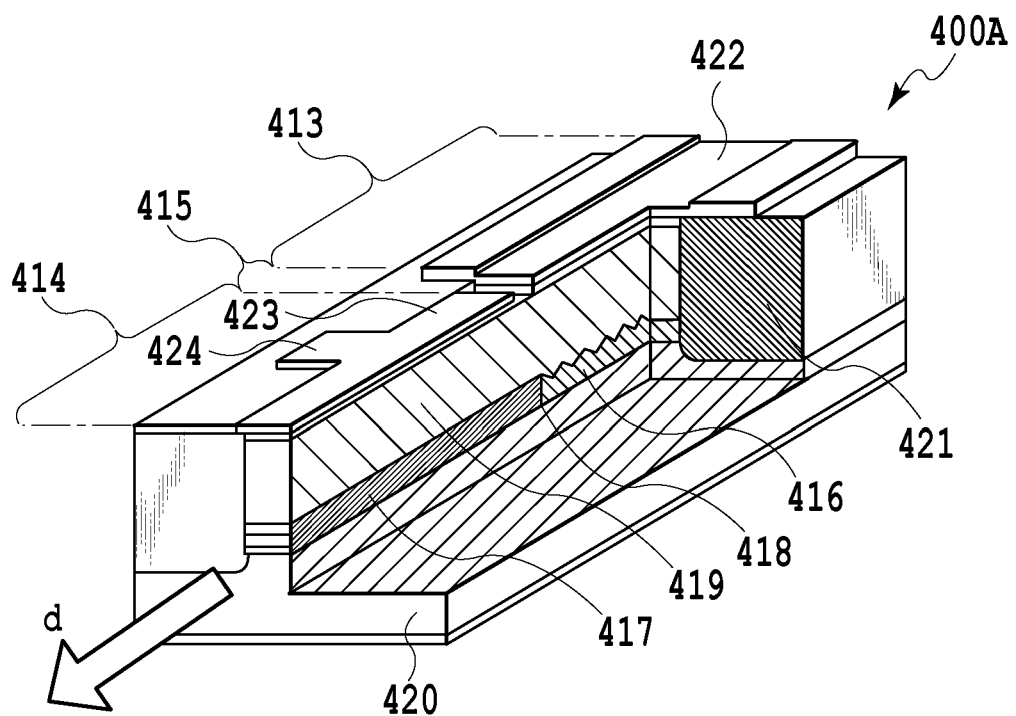
FIG. 4B is a perspective view illustrating the EAM integrated DFB laser.
Figure 4C:
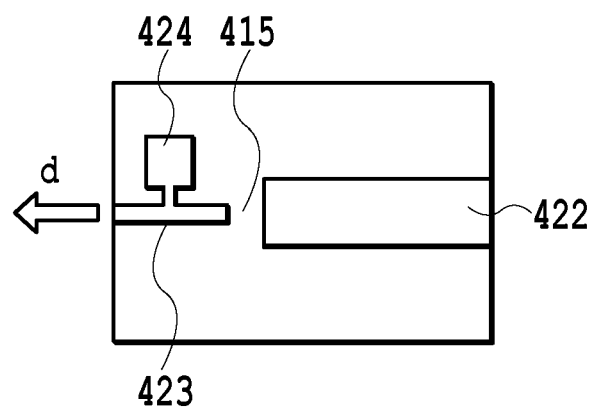
FIG. 4C is a top view illustrating the EAM integrated DFB laser.

With reference to FIG. 4B, the reference symbol R1 corresponds to the resistance of the clad layer 419 of the EAM, the reference symbol C1 corresponds to the capacitance of the pad 424, and the reference symbol C2 corresponds to the capacitance of the light-absorbing layer 417, respectively. The reference symbol R3 corresponds to the resistance of the light-absorbing layer 417 and the reference symbol R4 corresponds to the resistances of the clad layer 419 and the substrate 420, respectively.

Figure 18:
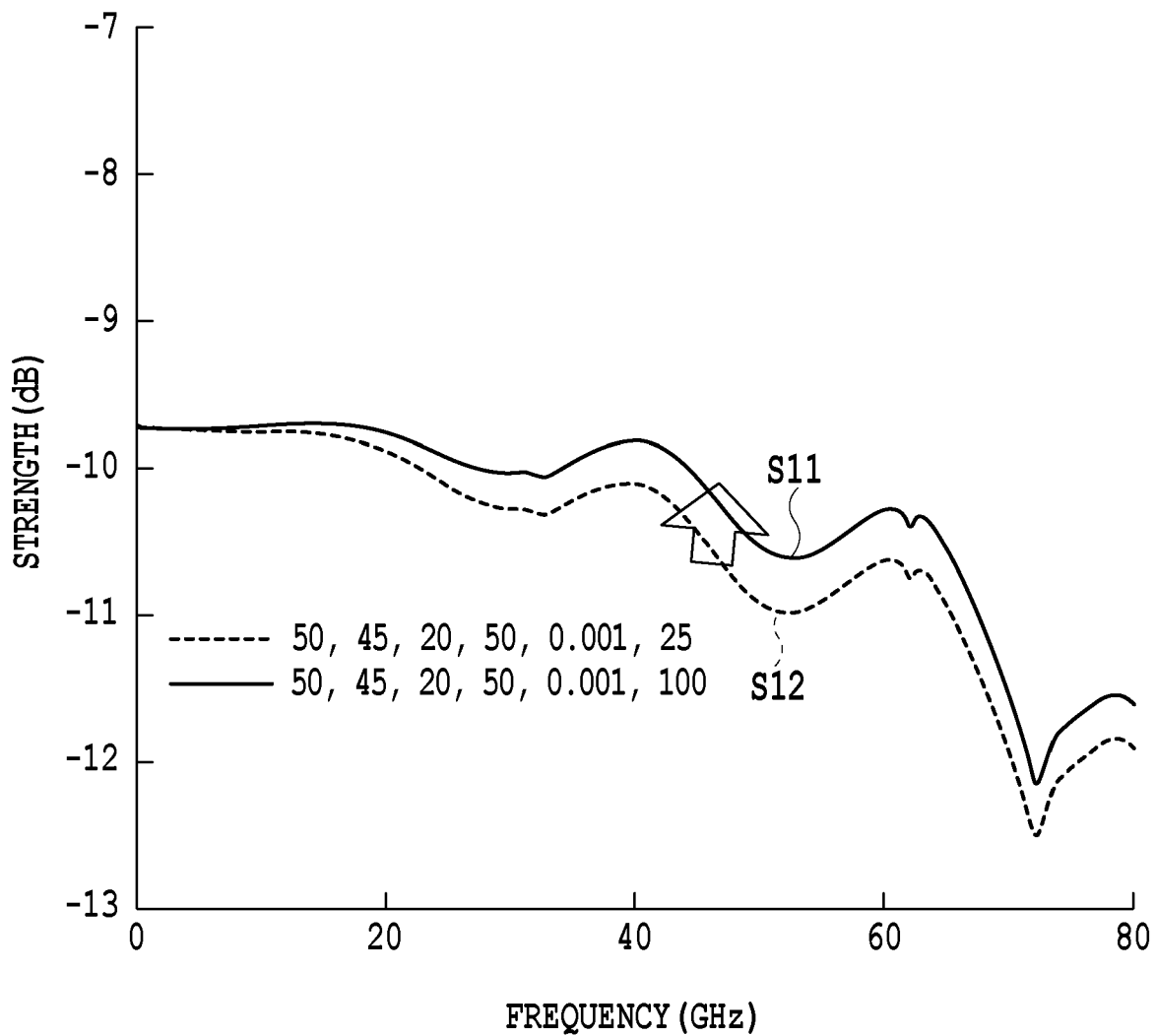
FIG. 18 is a diagram to explain a difference in the frequency response characteristic when the length of a resistive body is changed.

FIG. 18 shows the strength obtained by the simulation when the length "l" of the termination resistance 14 is changed. The strength S11 shows the one shown in FIG. 17 and the strength S12 shows the conventional one shown in FIG. 9A. As shown in FIG. 18, the change of the value "l" from 25 μm to 100 μm improves the bandwidth shown in S11.

Figure 19:
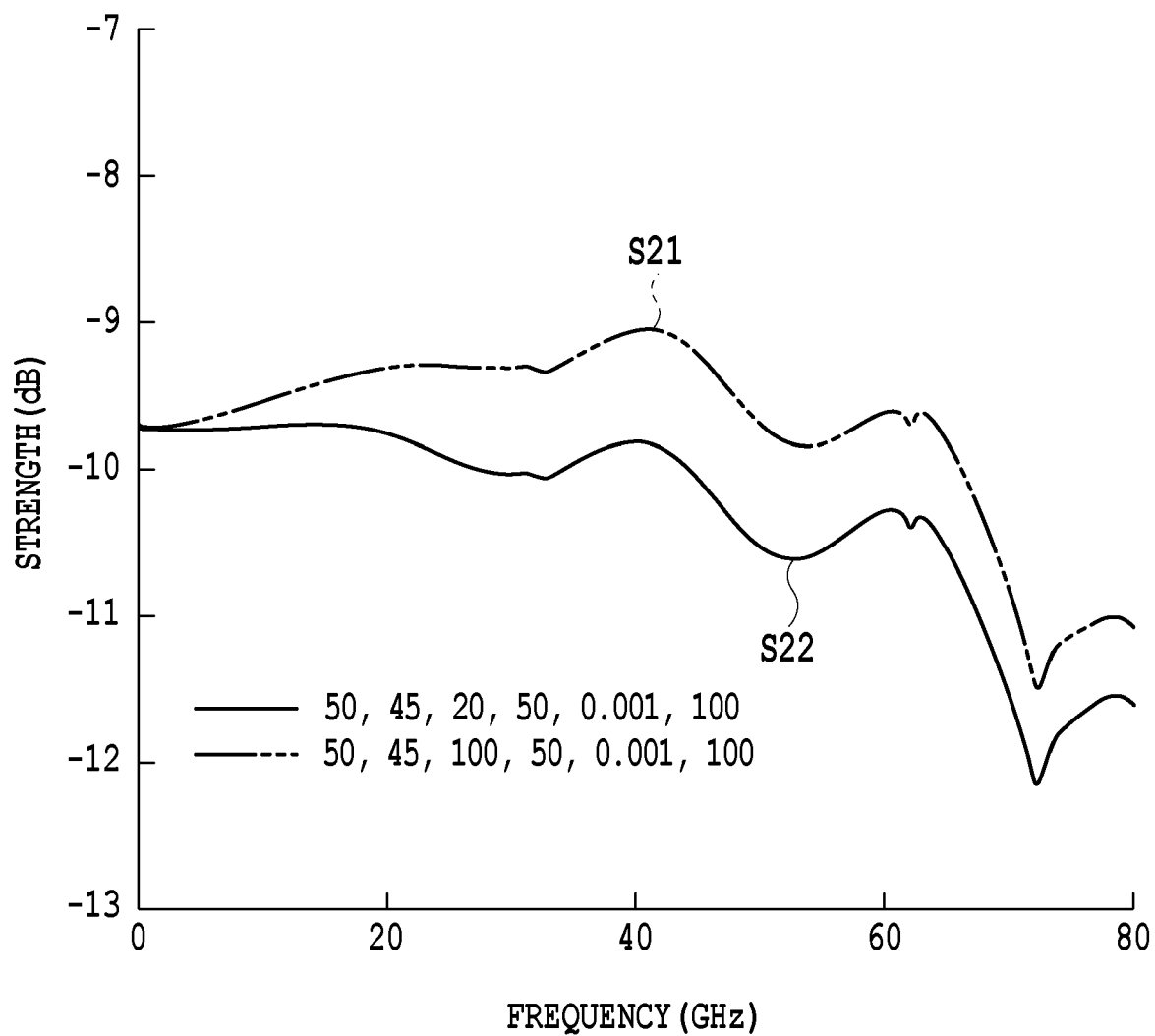
FIG. 19 is a diagram to explain a difference in the frequency response characteristic when the interval between the resistive body and the GND is changed.

FIG. 19 shows the strength obtained by simulation when the interval between the termination resistance 14 and the ground line 12 is changed. The strength S21 shows the one shown in FIG. 17 and the strength S22 shows the conventional one shown in FIG. 9A. As shown by the strengths S21 and S22, the change of the interval from 20 μm to 100 μm causes the peaking around 40 GHz, thereby improving the bandwidth shown by S21.

Figure 20:
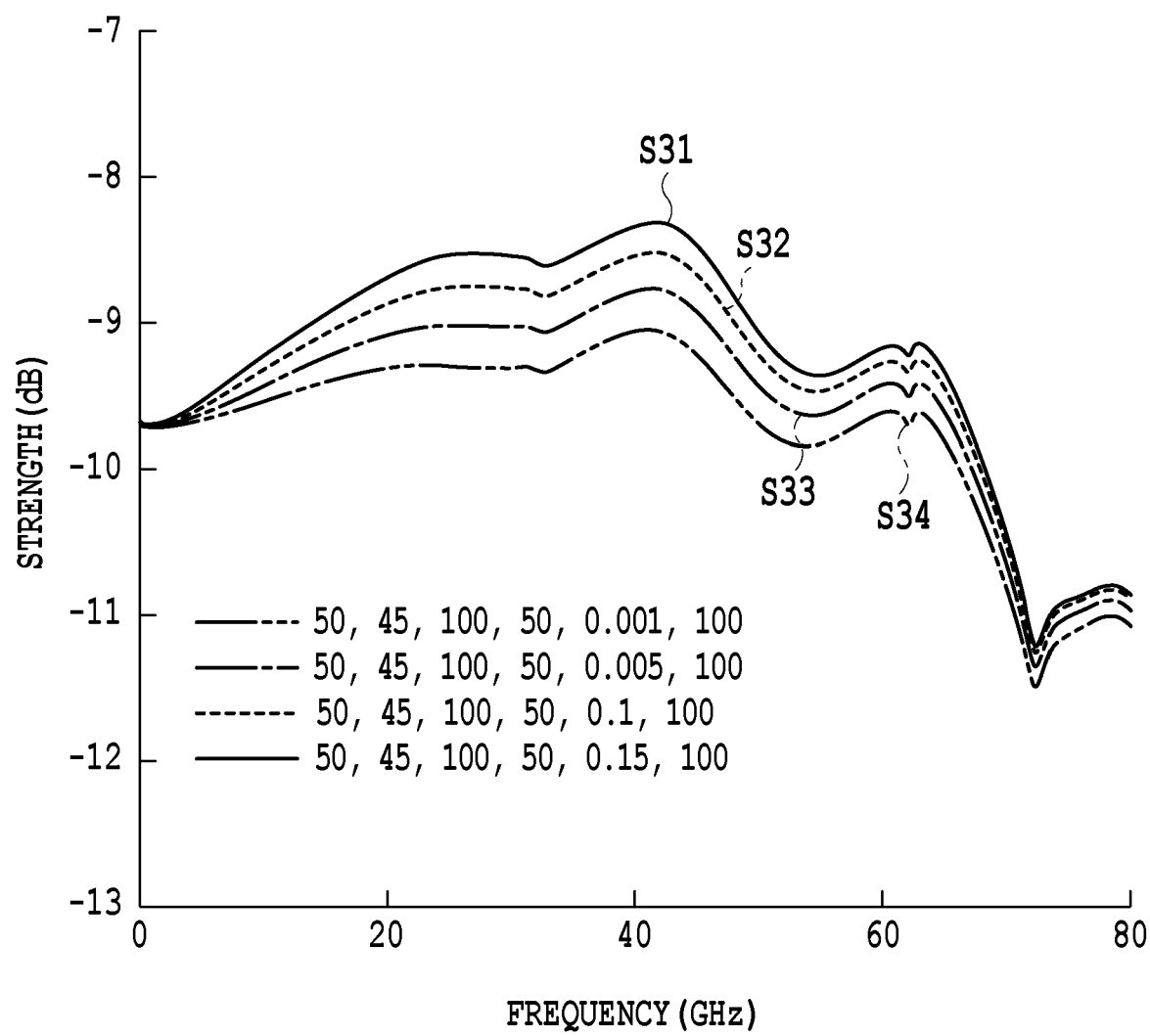
FIG. 20 is a diagram to explain a difference in the frequency response characteristic when the bandwidth is improved by peaking.

FIG. 20 shows the strength obtained by simulation when the length of the second high impedance line unit 34 is changed. The strengths S31, S32, and S33 show the ones when the second high impedance line unit 34 has lengths of 150 μm, 100 μm, and 50 μm. The strength S34 shows the conventional one shown in FIG. 9A (i.e., the one when the high impedance line unit 34 has a length of 0 μm). As shown by the strengths S31 to S34, the increase of the length of the second high impedance line unit 34 causes an increase of the strength of the peaking occurring around 40 GHz, thereby improving the bandwidth.

The above simulation shows that the change of the length of the second high impedance line unit 34 improves the bandwidth. However, the length of the second high impedance line unit 34 can be obtained based on the pattern preparation by photolithography with an accuracy within a range of ±5 μm or less. Thus, a desired peaking amount can be obtained.

As described above, according to the high-frequency transmission line 1 of this embodiment, the first conductor line and the ground line 12 are formed to have a line width decreasing toward the termination resistance 14, respectively. In this case, the termination resistance 14 and the second conductor line 15 combined with the ground line 12 increase the characteristic impedance to be higher than the characteristic impedance of the first conductor line 11, thereby improving the frequency characteristic.

The embodiment has been described above in detail. However, the specific configuration is not limited to this embodiment and may be changed.

Modification Example 1

Figure 21:
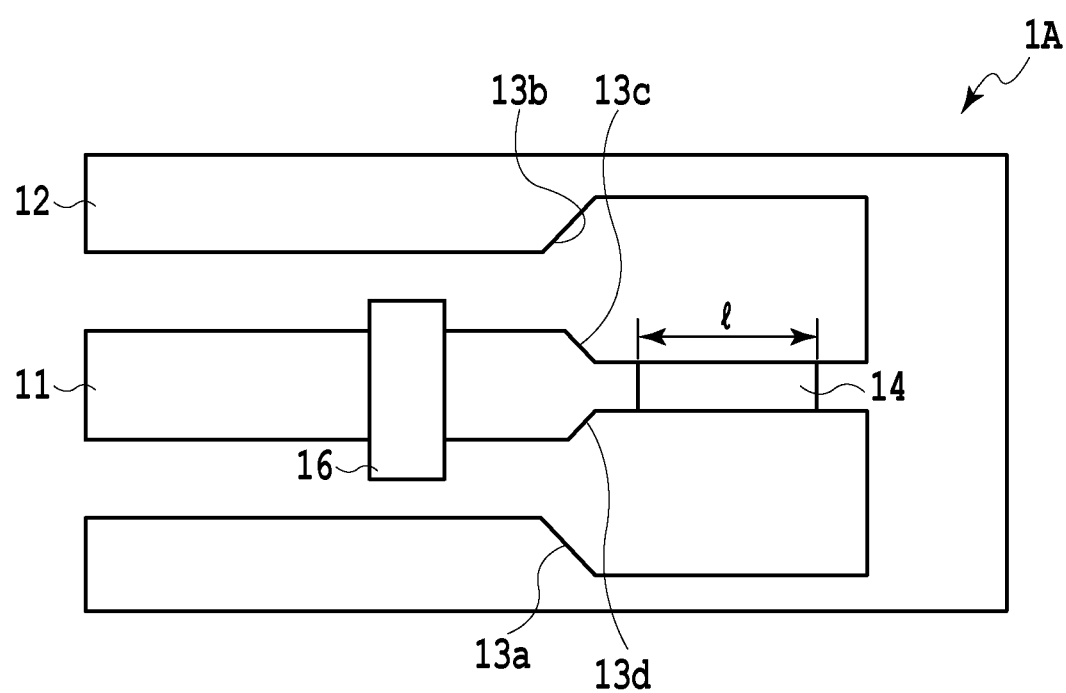
FIG. 21 illustrates a modification example of a high-frequency transmission line of an embodiment.

In the above description, a case was described in which the EAM 804 of the EML was connected between the conductor line 801 and the ground line 802. However, another case also may be considered in which the EAM 804 has the signal electrode and the ground electrode formed on different faces. FIG. 21 illustrates such a case in which the high-frequency transmission line 1A is configured so that the signal electrode and the ground electrode of the EAM are both flip chip-bonded by the first conductor line 11 for example.

Modification Example 2

The above-described bent shapes (tapered shapes) 13a to 13d may be the ones that allow the characteristic impedance to be higher than 50Ω for example and also may be substituted with various other shapes. For example, the bent shapes may be changed in a stepwise, curved, or continuous manner.

Modification Example 3

In the ones shown in FIG. 12 and FIG. 21, the tapered shape may be formed only in the first conductor line 11 and may not be formed in the ground line 12.

Modification Example 4

In the above description, there was no reference to the wiring pattern around the via in order to realize the connection between the above-described respective high-frequency transmission lines 1, 1A and the EAM 16. However, the via also may be used to connect the respective high-frequency transmission lines 1, 1A and the EAM 16.

Wiring Pattern Around the Via

Figure 9A:
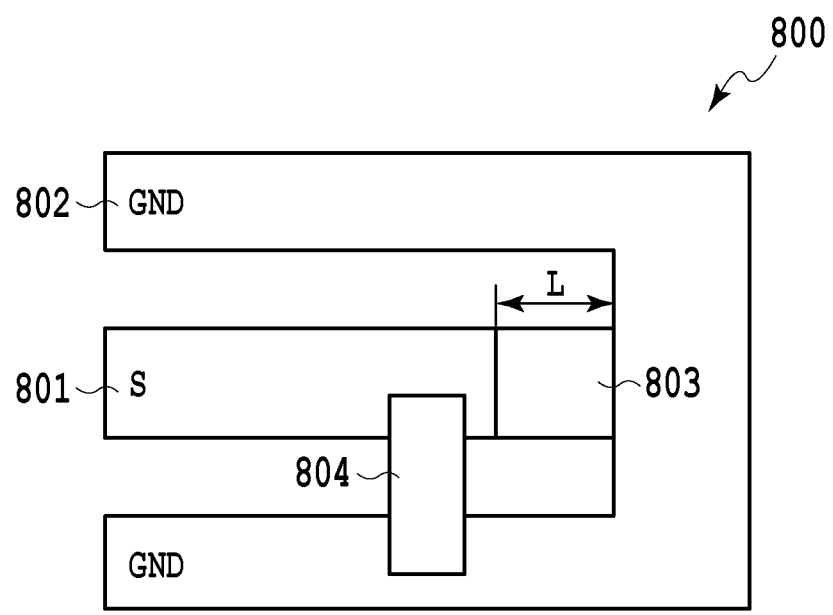
FIG. 9A is a schematic view of a termination circuit pattern of a conventional EML using a flip chip bonding.
Figure 9B:
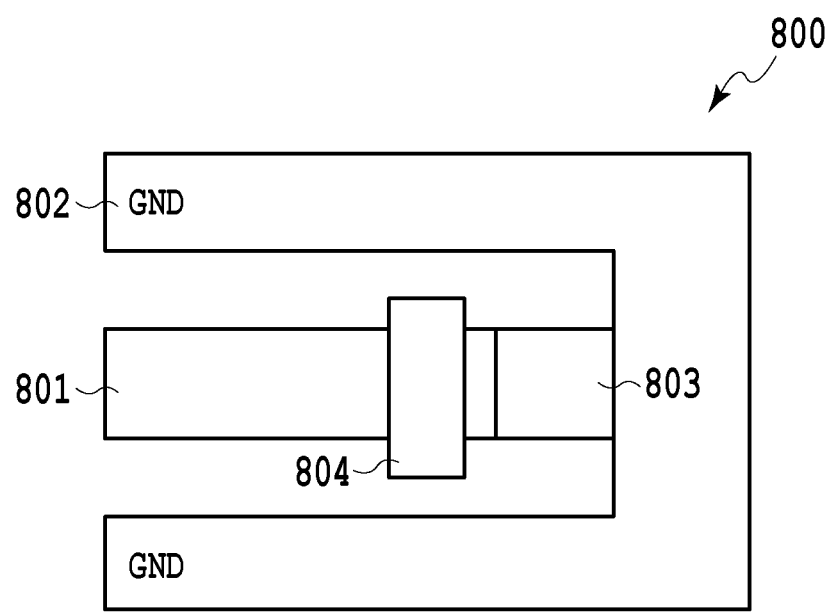
FIG. 9B is a schematic view of the termination circuit pattern of the conventional EML using the flip chip bonding.
Figure 10:
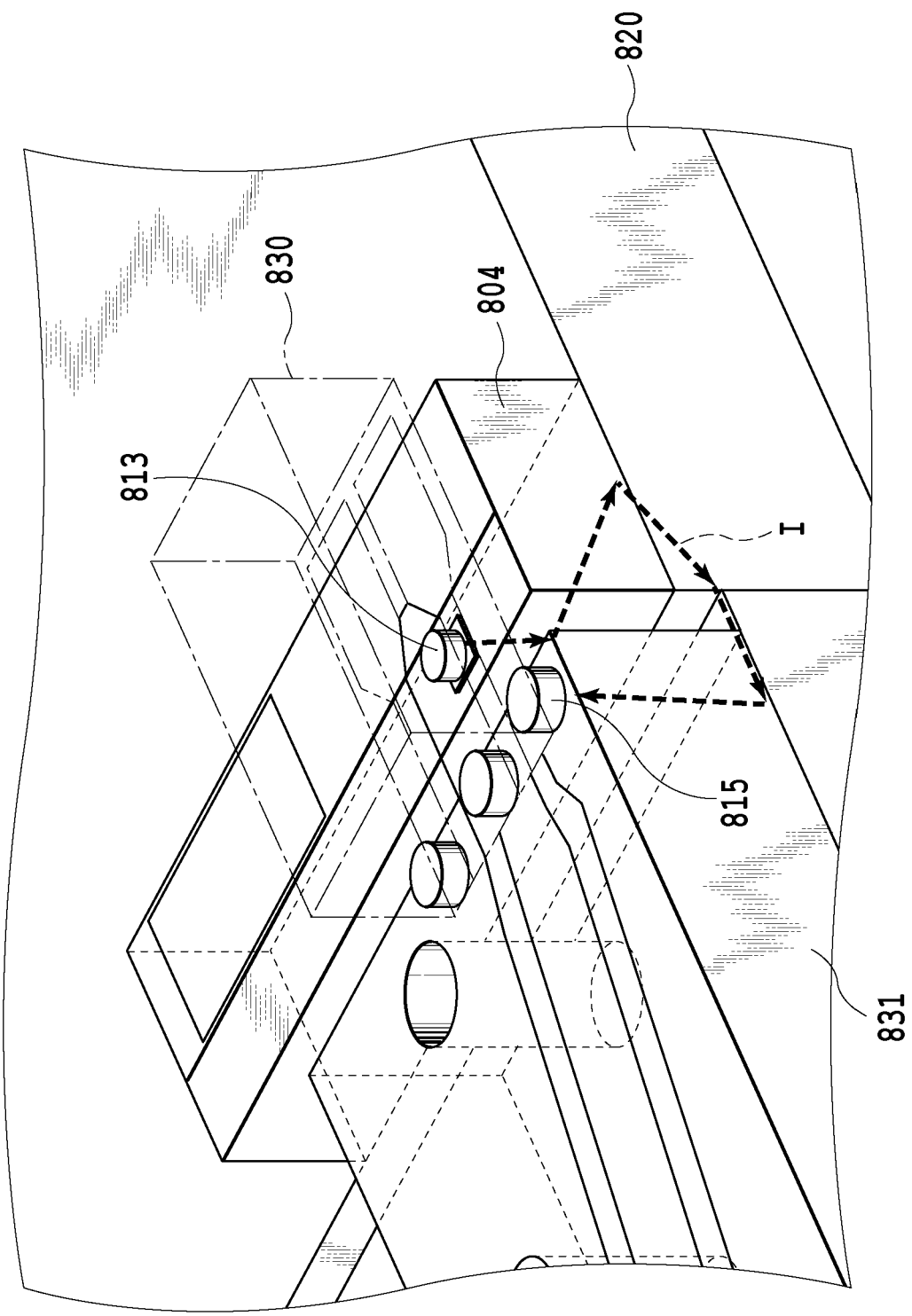
FIG. 10 is a perspective view illustrating a connection configuration of the EAM GND electrode and the ground when the EAM GND electrode is at a back face of a signal electrode.
Figure 11:
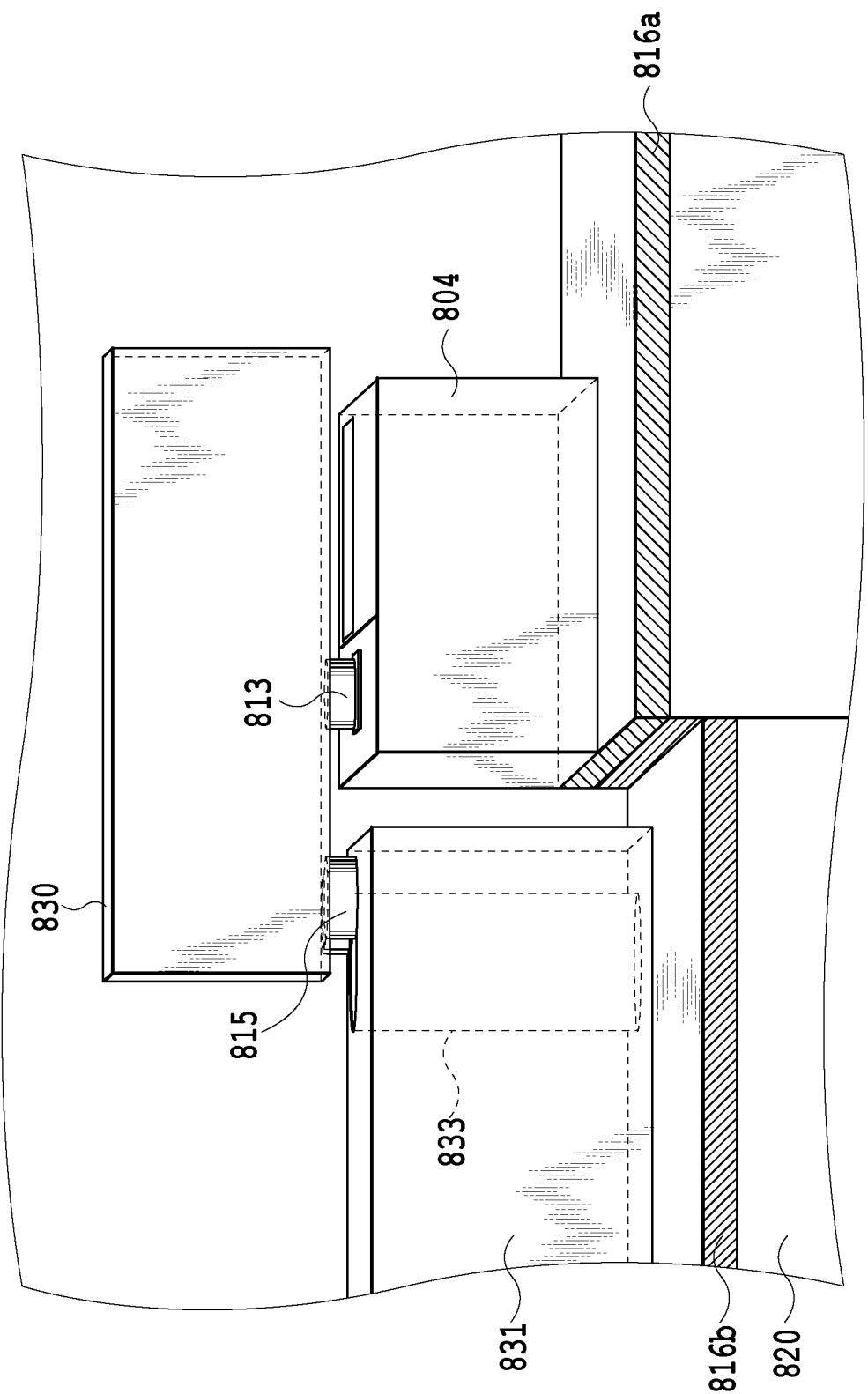
FIG. 11 is a cross-sectional view illustrating the connection configuration of FIG. 10.

The following section will describe the wiring pattern around the via for the purpose of realizing the connection to the EAM 16 with reference to FIG. 7C, FIG. 9A as well as FIG. 22A and FIG. 22B (which will be described later).

Figure 7A:
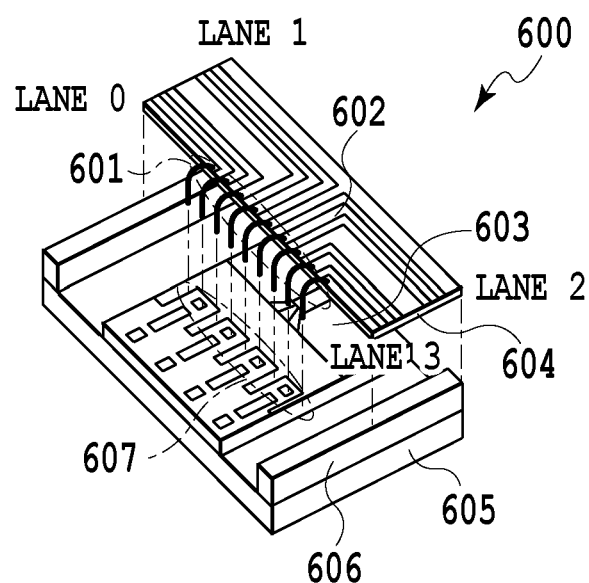
FIG. 7A illustrates the wire connection configuration of the EAM electrode and the wiring plate in the conventional multichannel optical transmitter.
Figure 7B:
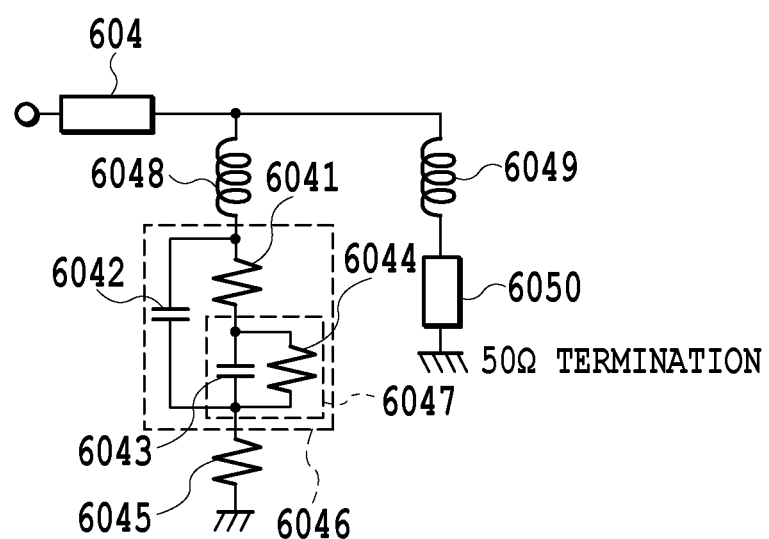
FIG. 7B shows the equivalent circuit of FIG. 7A.
Figure 7C:
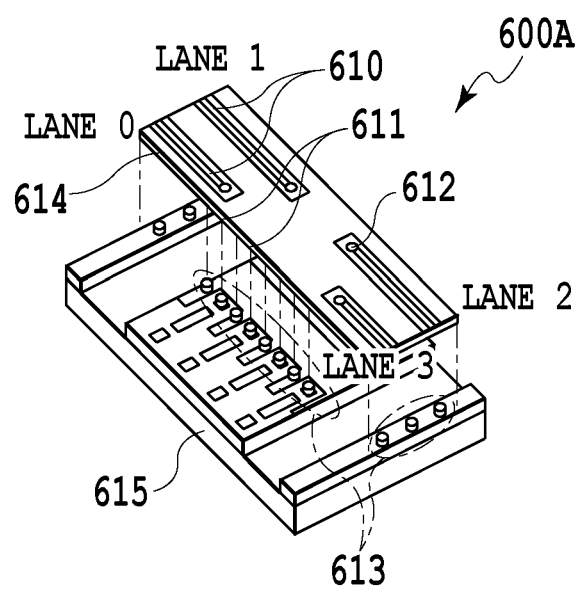
FIG. 7C illustrates the bump connection configuration of the EAM electrode and the wiring plate in the conventional multichannel optical transmitter.
Figure 7D:
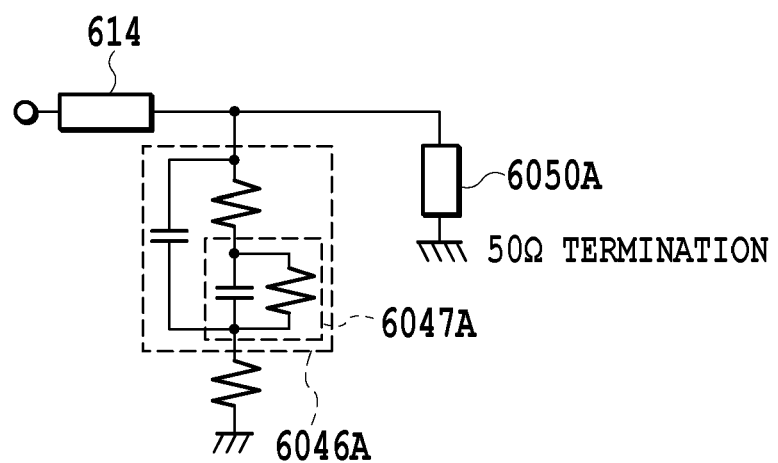
FIG. 7D shows the equivalent circuit of FIG. 7C.
Figure 7E:
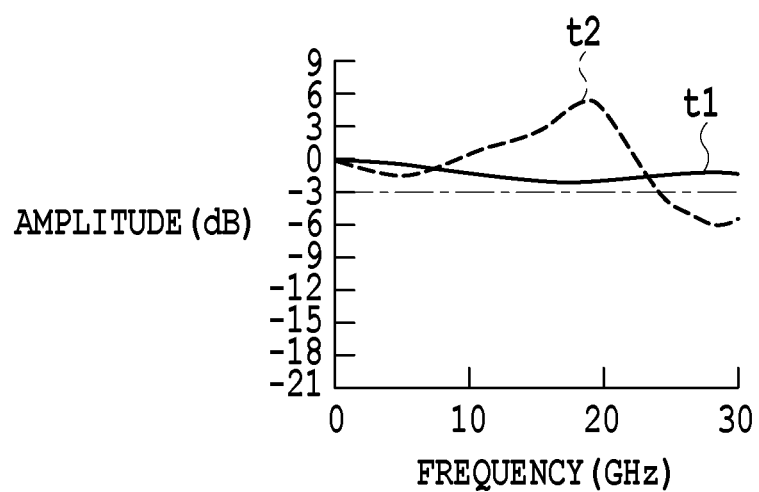
FIG. 7E illustrates the high-frequency characteristics of the conventional multichannel optical transmitter for the cases of the wire bonding and the flip chip bonding, respectively.
Figure 8A:
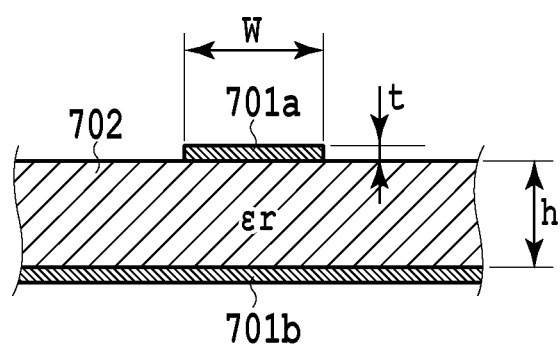
FIG. 8A illustrates the configuration of a conventional high-frequency dielectric plate.
Figure 8B:
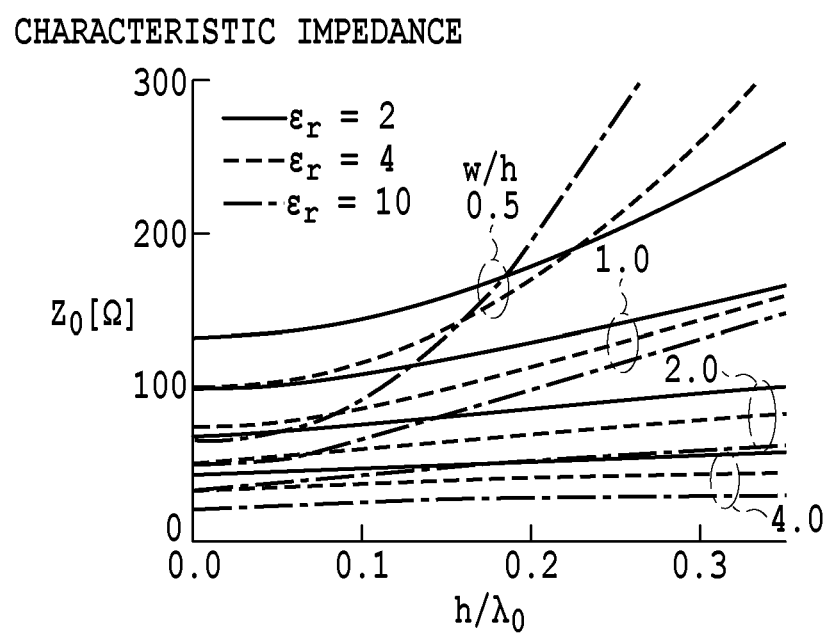
FIG. 8B illustrates the characteristic impedance depending on the permittivity in the conventional high-frequency dielectric plate.
Figure 8C:
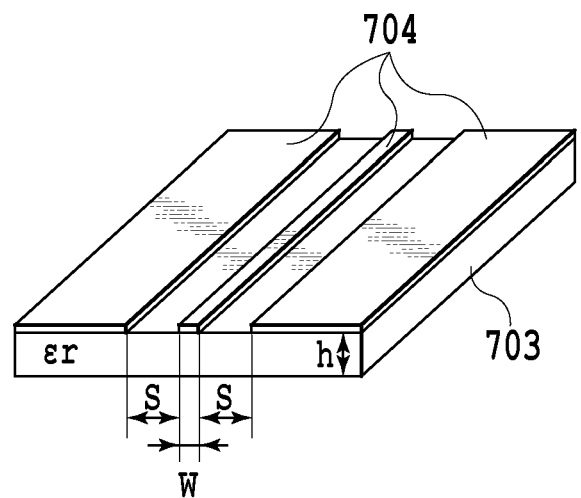
FIG. 8C illustrates the configuration of a wiring plate formed by coplanar lines.
Figure 8D:
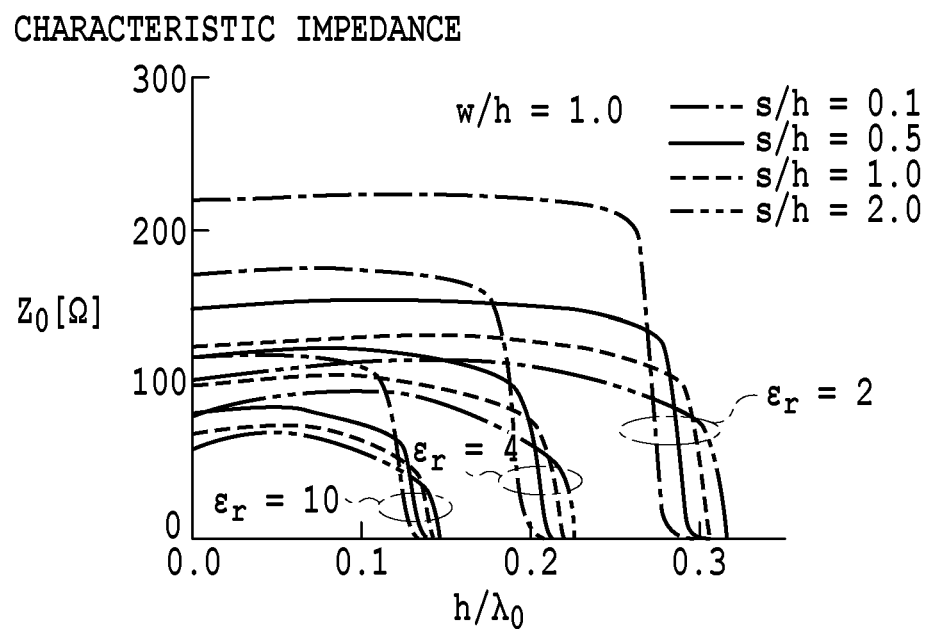
FIG. 8D illustrates the characteristic impedance depending on the value of s/h in a wiring plate for which w/h=1.0 is established.

In FIG. 7C, the conventional high-frequency circuit plate 614 is connected to the EAM on the subcarrier 615 via the RF via 612. However, the high-frequency circuit plate 614 is designed so that a long distance is provided between the signal around the RF via 612 and the ground. The RF via 612 is also designed to have the characteristic impedance of close to 50Ω. However, in order to improve the frequency response characteristic, the short distance provided between the EAM and the RF via 612 requires, not a distributed constant line design but a concentrated constant line design.

Due to the above reason, the above-described high-frequency transmission lines 1, 1A are configured so that the distance between the signal around the via (connection region) and the ground is shorter than in the conventional case. The characteristic impedance of the via is made lower than 50Ω so that the frequency response characteristic can be improved. The via functioning as the connection region also may be a hole.

Figure 22A:
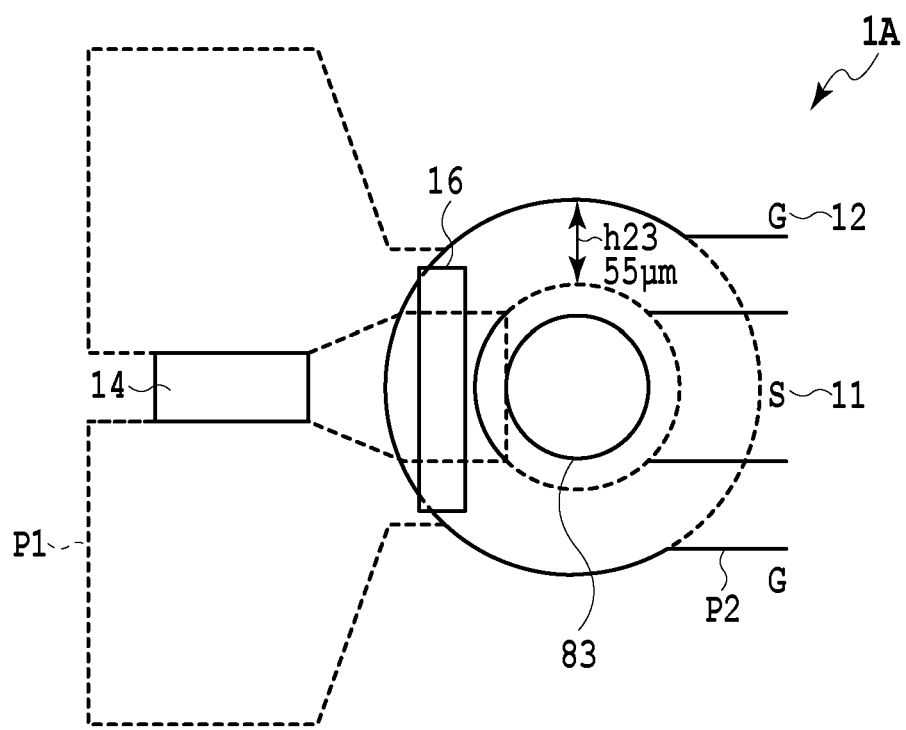
FIG. 22A illustrates an example of a wiring pattern at the periphery of a via in the high-frequency transmission line of FIG. 21.

FIG. 22A shows the wiring pattern around the via 83 of the high-frequency transmission line 1A as described above. The high-frequency transmission line 1A of FIG. 22A has the same configuration as that of the high-frequency transmission line 1A shown in FIG. 21. The wiring pattern P1 in FIG. 22A is formed on the lower face of the high-frequency transmission line 1A and the wiring pattern P2 is formed on the upper face of the high-frequency transmission line 1A.

In FIG. 22A, the high-frequency transmission line 1A is configured so that the distance h23 between the high-frequency line S(11) of the wiring pattern P2 and the ground line G(12) in the diameter direction of the via 83 is 55 μm for example. Specifically, the distance between the high-frequency line S and the ground line G is shorter than the conventional one (for which the characteristic impedance is 50Ω). At the via 83, the signal electrode of the EAM 16 is provided in the ground line G(12) of the wiring pattern P2 when FIG. 22A is seen from the above.

As a result, the lower face-side capacitance of the high-frequency transmission line 1A is higher than the conventional one, which causes the characteristic impedance of the high-frequency transmission line 1A to be lower than the conventional one, thus improving the high-frequency-side frequency characteristic.

Figure 22B:
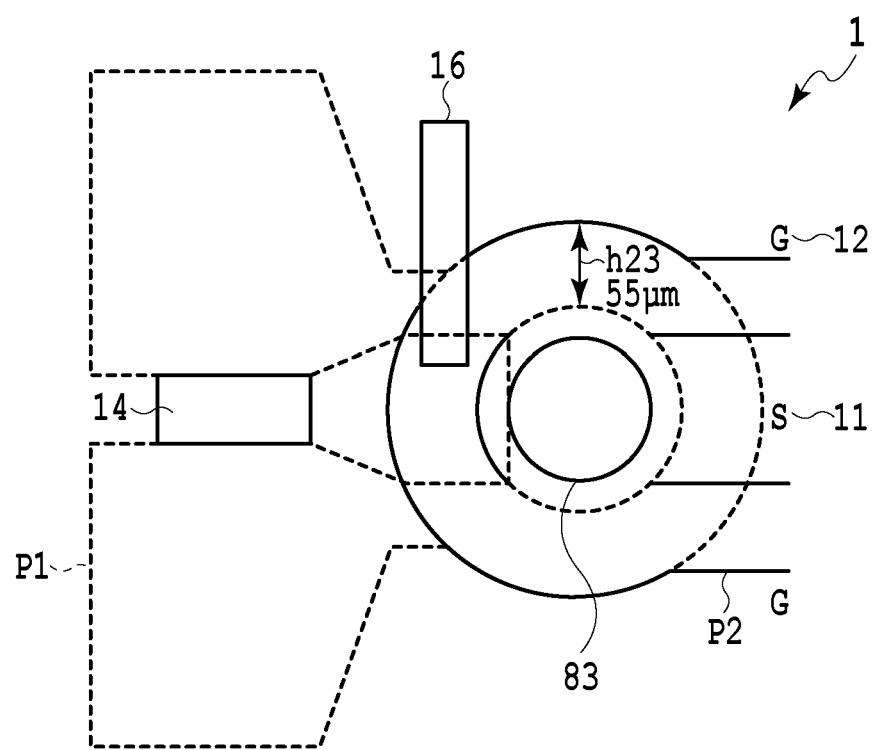
FIG. 22B illustrates an example of a wiring pattern at the periphery of the via in the high-frequency transmission line of FIG. 12.

In FIG. 22B, the high-frequency transmission line 1 has the same configuration as that of the high-frequency transmission line 1 shown in FIG. 12. Thus, the EAM 16 is different from FIG. 22A in being connected between the high-frequency line S (11) of the high-frequency transmission line 1 and the ground line G (12). In this case, the wiring pattern P2 of the via 83 of FIG. 22B is similar to that shown in FIG. 22A in that the distance h23 between the high-frequency line S(11) and the ground line G(12) is 55 μm for example. Specifically, the distance between the high-frequency line S and the ground line G is shorter than the conventional one (for which the characteristic impedance is 50Ω). This allows the lower face-side capacitance of the high-frequency transmission line 1 to be higher than the conventional one, which causes the high-frequency transmission line 1 to have a characteristic impedance lower than the conventional one, thus improving the high frequency-side frequency characteristic.

Modification Example 5

Figure 23:
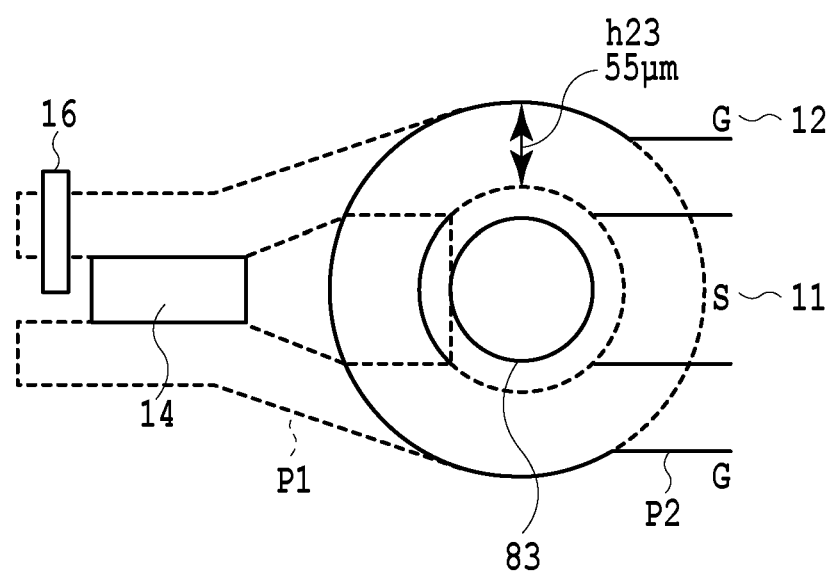
FIG. 23 illustrates an example of a wiring pattern at the periphery of the via in the high-frequency transmission line in DML.

The wiring patterns P1 and P2 shown in FIG. 22A and FIG. 22B can be applied to the EML or DML (Direct Modulated DFB Laser). For example, FIG. 23 shows an example of the wiring patterns P1 and P2 around the via in the DML. In FIG. 23, the same reference symbols as those used in the description for FIG. 22A and FIG. 22B are directly used.

Modification Example 6

The high-frequency transmission lines of the above embodiment and modification examples also can be configured to have an array structure including laser.

The above embodiment and modification examples for example can be carried out in an arbitrary combination.

REFERENCE SIGNS LIST 1, 1A High-frequency transmission line
11 First conductor line
12 Ground line
13a to 13d Bent shape (tapered shape)
14 Termination resistance
15 Second conductor line

The invention claimed is:

1. An optical circuit having a high-frequency transmission line, comprising:
 a first conductor line having a characteristic impedance;
 a termination resistance connected to the first conductor line;
 a second conductor line connected to the termination resistance; and
 a ground line that is provided to be opposed to the first conductor line, the termination resistance, and the second conductor line, and the ground line is provided to have a distance thereto, wherein the ground line is connected to the second conductor line,
wherein:
 the first conductor line and the ground line are formed so as to have a line width decreasing toward the termination resistance side, respectively thereby forming an impedance transition unit,
 the optical circuit includes an electroabsorption (EA) modulator integrated distributed feedback (DFB) laser,
 the EA modulator has a signal input electrode and a ground electrode,
 the signal input electrode of the EA modulator is connected to the first conductor line through a via, and
 the ground electrode of the EA modulator is connected to the ground line through the via, and the signal input electrode of the EA modulator is encircled in the ground line of the wiring pattern when seen from above.

2. The optical circuit according to claim 1, further comprising a connection region penetrating through the high-frequency transmission line for providing a connection to a modulator, wherein:
 around the connection region, a distance between the first conductor line and the ground line in an upper face of the high-frequency transmission line is set so that an impedance of the connection region is lower than the characteristic impedance.

3. The optical circuit according to claim 2, wherein a characteristic impedance of the connection region is lower than 50Ω.

4. The optical circuit according to claim 1, wherein:
 the termination resistance and the second conductor line combined with the ground line have a characteristic impedance higher than the characteristic impedance of the first conductor line.

5. The optical circuit according to claim 1, wherein:
 the first conductor line and the ground line have the line width narrowed by a tapered shape.

* * * * *